United States Patent
Lin et al.

(10) Patent No.: US 9,496,041 B2
(45) Date of Patent: Nov. 15, 2016

(54) MEMORY PROGRAMMING METHOD, MEMORY CONTROL CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Cheng Hsu, Yilan County (TW); An-Cheng Liu, Taipei (TW); Siu-Tung Lam, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/692,759

(22) Filed: Apr. 22, 2015

(65) Prior Publication Data

US 2016/0240256 A1    Aug. 18, 2016

(30) Foreign Application Priority Data

Feb. 16, 2015    (TW) .............................. 104105289 A

(51) Int. Cl.
*G11C 16/10* (2006.01)
*G11C 16/34* (2006.01)

(52) U.S. Cl.
CPC ........... *G11C 16/10* (2013.01); *G11C 16/3459* (2013.01)

(58) Field of Classification Search
CPC ........................... G11C 16/10; G11C 16/3459
USPC ............................ 365/185.22, 185.24, 185.3
See application file for complete search history.

(56) References Cited

U.S. PATENT DOCUMENTS

| | | | | |
|---|---|---|---|---|
| 5,943,260 A | * | 8/1999 | Hirakawa | G11C 11/5621 365/185.03 |
| 6,396,742 B1 | * | 5/2002 | Korsh | G11C 11/56 365/185.03 |
| 9,129,682 B2 | * | 9/2015 | Leem | G11C 16/10 |
| 2004/0170062 A1 | * | 9/2004 | Micheloni | G11C 11/5628 365/185.29 |
| 2007/0279985 A1 | * | 12/2007 | Hemink | G11C 11/5628 365/185.17 |
| 2008/0158952 A1 | * | 7/2008 | Aritome | G11C 11/5628 365/185.03 |
| 2008/0158996 A1 | * | 7/2008 | Kamei | G11C 11/5628 365/185.22 |
| 2008/0316830 A1 | * | 12/2008 | Yang | G11C 16/30 365/185.18 |

(Continued)

*Primary Examiner* — Vu Le
*Assistant Examiner* — Sung Cho
(74) *Attorney, Agent, or Firm* — Jianq Chyun IP Office

(57) ABSTRACT

A memory programming method for a rewritable non-volatile memory module having memory cells is provided. The memory programming method includes: performing a first programming process on the memory cells according to write data and obtaining a first programming result of the first programming process; grouping the memory cells into programming groups according to the first programming result; and performing a second programming process on the memory cells according to the write data. The second programming process includes: programming a first programming group among the programming groups by using a first program voltage; and programming a second programming group among the programming groups by using a second program voltage. The first program voltage and the second program voltage are different. Moreover, a memory control circuit unit and a memory storage device are provided.

24 Claims, 20 Drawing Sheets

(56) References Cited

U.S. PATENT DOCUMENTS

| | | | | |
|---|---|---|---|---|
| 2009/0285023 A1* | 11/2009 | Cho | ................... | G11C 11/5628 365/185.03 |
| 2009/0296466 A1* | 12/2009 | Kim | ................... | G11C 11/5628 365/185.03 |
| 2011/0103151 A1* | 5/2011 | Kim | ................... | G11C 11/5628 365/185.19 |
| 2011/0235420 A1* | 9/2011 | Sharon | ................ | G11C 11/5642 365/185.17 |
| 2012/0044768 A1* | 2/2012 | Jones | ...................... | G11C 16/10 365/185.19 |
| 2013/0028018 A1* | 1/2013 | Cho | ................... | G11C 11/5628 365/185.03 |
| 2013/0163324 A1* | 6/2013 | Noh | ................... | G11C 11/5628 365/185.02 |
| 2013/0201762 A1* | 8/2013 | Izumi | ................ | G11C 16/0483 365/185.17 |
| 2014/0025866 A1* | 1/2014 | Kim | ................... | G06F 12/0246 711/103 |
| 2014/0226398 A1* | 8/2014 | Desireddi | .......... | G11C 16/3436 365/185.03 |
| 2015/0006791 A1* | 1/2015 | Yoo | ........................ | G11C 16/10 711/103 |
| 2015/0063029 A1* | 3/2015 | Lee | ................... | G11C 16/3427 365/185.12 |
| 2015/0155040 A1* | 6/2015 | Shim | ...................... | G11C 16/10 365/185.25 |
| 2015/0221380 A1* | 8/2015 | Lee | ........................ | G11C 16/10 365/185.11 |

* cited by examiner

|  | Cell1 | Cell2 | Cell3 | Cell4 | Cell5 |
|---|---|---|---|---|---|
| Storage state of the memory cells corresponding to $V_{G1}$ | "1" | "0" | "0" | "0" | "0" |
| Storage state of the memory cells corresponding to $V_{G2}$ | "1" | "1" | "0" | "0" | "0" |
| Storage state of the memory cells corresponding to $V_{G3}$ | "1" | "1" | "1" | "0" | "0" |
| Storage state of the memory cells corresponding to $V_{G4}$ | "1" | "1" | "1" | "1" | "0" |

Grouped programming groups ⇓ A1 ⇓ B1 ⇓ C1 ⇓ D1 ⇓ E1

FIG. 12

MEMORY PROGRAMMING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 104105289, filed on Feb. 16, 2015. The entirety of the above-mentioned patent application is hereby incorporated by reference herein and made a part of this specification.

BACKGROUND

1. Technology Field

The present relates to a memory programming method and more particularly, to a memory programming method, a memory control circuit unit and a memory storage device for a rewritable non-volatile memory module.

2. Description of Related Art

Along with the widespread of digital cameras, cell phones, and MP3 players in recently years, the consumers' demand to storage media has increased drastically. Because a rewritable non-volatile memory is capable of providing features such as data non-volatility, low power consumption, small volume, and non-mechanical structure, high reading and writing speed, the rewritable non-volatile memory has become the most adaptable memory applied in a portable electronic product, e.g., a notebook computer. Therefore, the flash memory industry has become a very popular part of the electronic industry in recent years.

Generally, a flash memory may be programmed to change a storage state of memory cells in the flash memory to write data. However, programming the memory cells in the flash memory by using the traditional method for programming the flash memory may result in overly increased threshold voltage distribution range of part of the memory cells whose storage state already meet the storage state of the write data (which is also referred to as part of the memory cells being over-programmed), and durability of the over-programmed memory cells may be reduced, and further the overall lifespan of the flash memory may be shortened.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a memory programming method, a memory storage device and a memory control circuit unit capable of grouping a plurality of memory cells into a plurality of programming groups to apply an adaptive program voltage to the memory cells in each programming group, so as to effectively prevent the memory cells from being over-programmed and extend the lifespan of the memory storage device.

According to an exemplary embodiment of the present invention, a memory programming method for a rewritable non-volatile memory module is provided. The rewritable non-volatile memory module has a plurality of memory cells. The memory programming method includes: performing a first programming process on the memory cells according to write data and obtaining a first programming result of the first programming process; grouping the memory cells into a plurality of programming groups according to the first programming result; and performing a second programming process on the memory cells according to the write data. The second programming process includes programming a first programming group among the programming groups by using a first program voltage; and programming a second programming group among the programming groups by using a second program voltage. Therein, the first program voltage and the second program voltage are different.

According to another exemplary embodiment of the present invention, a memory storage device including a connection interface unit, a rewritable non-volatile memory module and a memory control circuit unit is provided. The rewritable non-volatile memory module includes a plurality of memory cells. The memory control circuit unit is coupled to the connection interface unit and the rewritable non-volatile memory module. The memory control circuit unit is configured to transmit a first write command sequence. The first write command sequence is configured to instruct to perform a first programming process on the memory cells according to write data. The memory control circuit unit is further configured to obtain a first programming result of the first programming process and group the memory cells into a plurality of programming groups according to the first programming result. The memory control circuit unit is further configured to transmit a second write command sequence. The second write command sequence is configured to instruct to perform a second programming process on the memory cells according to the write data. The second programming process includes: programming a first programming group among the programming groups by using a first program voltage; and programming a second programming group among the programming groups by using a second program voltage. Therein, the first program voltage and the second program voltage are different.

According to another exemplary embodiment of the present invention, a memory control circuit unit configured to control a rewritable non-volatile memory module is provided. The rewritable non-volatile memory module includes a plurality of memory cells. The memory control circuit unit includes a host interface, a memory interface and a memory management circuit. The host interface is coupled to host system. The memory interface is coupled to the rewritable non-volatile memory module. The memory management circuit is coupled to the host interface and the memory interface. The memory management circuit is configured to transmit a first write command sequence. The first write command sequence is configured to instruct to perform a first programming process on the memory cells according to write data. The memory management circuit is further configured to obtain a first programming result of the first programming process and group the memory cells into a plurality of programming groups according to the first programming result. The memory management circuit is further configured to transmit a second write command sequence. The second write command sequence is configured to instruct to perform a second programming process on the memory cells according to the write data. The second programming process includes: programming a first programming group among the programming groups by using a first program voltage; and programming a second programming group among the programming groups by using a second program voltage. Therein, the first program voltage and the second program voltage are different.

To sum up, the memory programming method, the memory control circuit unit and the memory storage device provided by the present invention may facilitate in adjusting the program voltage applied to the memory cells according to the threshold voltage distribution (or a writing speed) of the memory cells to prevent the memory cells from being over-programmed, so as to extend the lifespan of the memory storage device. Meanwhile, the threshold voltage distribution range of the programmed memory cells can be accordingly narrowed, so as to reduce error bits occurring in the stored data.

In order to make the aforementioned and other features and advantages of the invention more comprehensible, several embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 12 is a schematic diagram of determining the programming groups according to an exemplary embodiment of the present invention.

DESCRIPTION OF THE EMBODIMENTS

Figure 1:
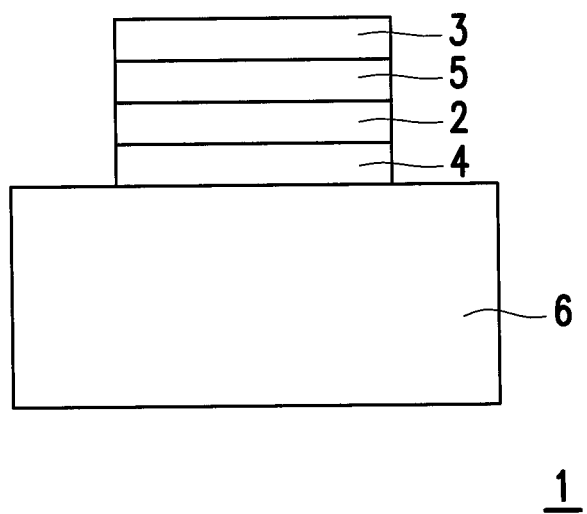
FIG. 1 is a schematic diagram illustrating a flash memory element (also referred to as a memory cell) according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic diagram illustrating a flash memory element according to an exemplary embodiment of the present invention.

With reference to FIG. 1, in the present exemplary embodiment, a flash memory element 1 (also referred to as a memory cell) includes a charge-trapping layer 2 for storing electrons, a control gate 3 for applying a voltage, a tunnel oxide layer 4, an interpoly dielectric layer 5, and a substrate 6. When it is intended to write data into the flash memory element 1, electrons may be injected into the charge-trapping layer 2 by applying a program voltage (also referred to as a program voltage), so as to change a voltage of the flash memory element 1. In the exemplary embodiments below, the voltage of the flash memory element 1 is also referred to as a threshold voltage of the flash memory element 1. The threshold voltage may be configured to indicate a data storage state of the flash memory element 1. Accordingly, a digital-level state (i.e., a storage state) of the flash memory element 1 is defined, so as to store data. Here, the process of injecting the electrons into the charge-trapping layer 2 is referred to as a programming process. By contrast, when it is intended to remove the stored data, an erase voltage is applied, so as to remove the injected electrons from the charge-trapping layer 2, and thereby the flash memory element 1 is restored back to the state before programming.

Figure 2:
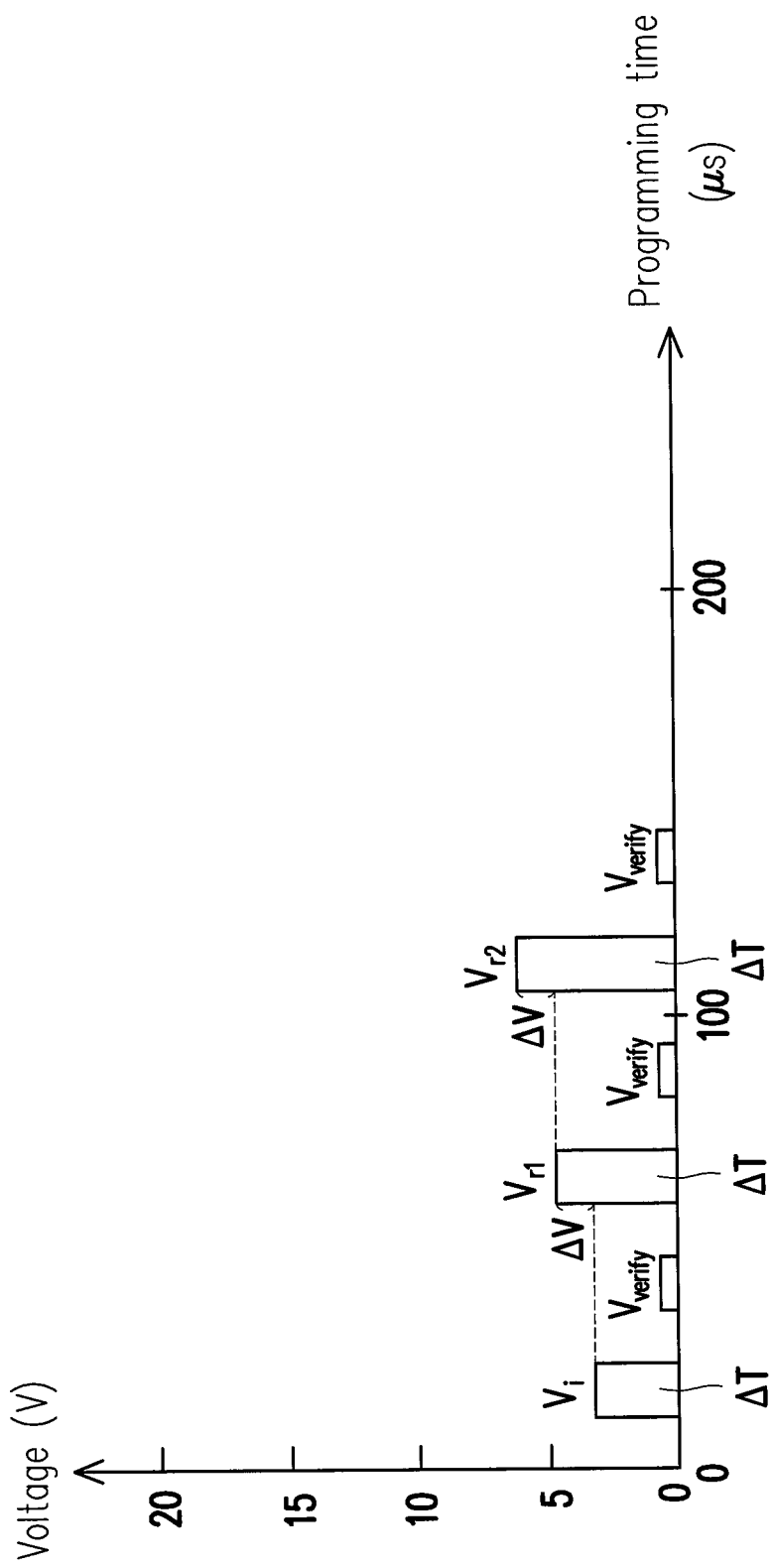
FIG. 2 is a schematic diagram of programming memory cells according to an exemplary embodiment of the present invention.

FIG. 2 is a schematic diagram of programming memory cells according to an exemplary embodiment of the present invention.

With reference to FIG. 2, in the present exemplary embodiment, the programming operation of the memory cells is performed by using an incremental-step-pulse programming (ISPP) model and by pulse writing and applying a verification threshold voltage. Particularly, when data is about to be programmed to memory cells, an initial program voltage $V_i$ and a program voltage pulse time $\Delta T$ are set. When the data is programmed to the memory cells, the set program voltage $V_i$ and the set program voltage pulse time $\Delta T$ are used to program the memory cells. A verification voltage $V_{verify}$ may be configured to verify the memory cells to determine whether the memory cells is in an accurate storage state. If the memory cells is not yet programmed to be in the accurate storage state, the currently applied program voltage is added with an ISPP adjustment value $\Delta V$ as a new program voltage (e.g., $V_{r1}$, $V_{r2}$ in FIG. 2) and the memory cell is programmed again according to the new program voltage and the program voltage pulse time $\Delta T$. If the memory cells is programmed to be in the accurate storage state, it represents that the data is accurately written into the memory cells.

Figure 3:
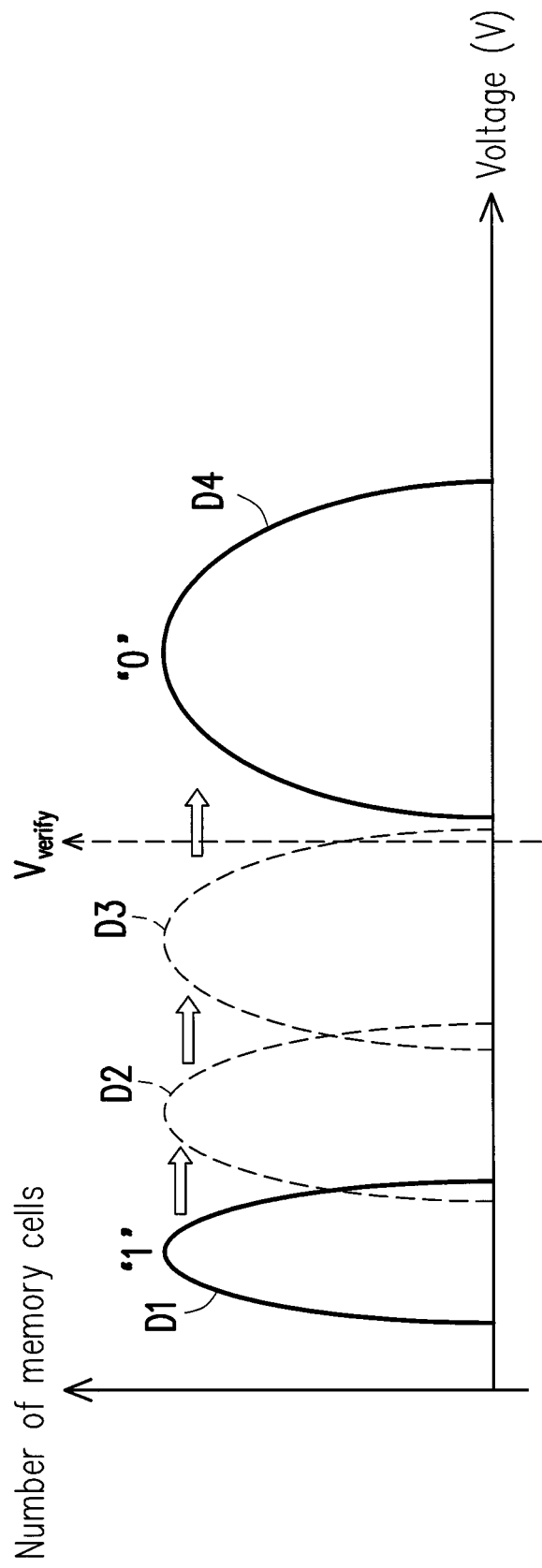
FIG. 3 is a schematic graph illustrating a threshold voltage distribution of a plurality of memory cells in a programming operation according to an exemplary embodiment of the present invention.

FIG. 3 is a schematic graph illustrating a threshold voltage distribution of a plurality of memory cells in a programming operation according to an exemplary embodiment of the present invention.

With reference to both FIG. 2 and FIG. 3, it is assumed that a plurality of memory cells is programmed to be in a storage state with a storage bit of "0". A threshold voltage distribution of the memory cells before being programmed is presented by a solid line D1 (which is also referred to as a threshold voltage distribution D1) illustrated in FIG. 3, and an initial storage state of the memory cells is "1". Additionally, it is assumed that the memory cells are programmed by using the ISPP model of FIG. 2. When the memory cells are programmed by using the initial program voltage $V_i$, the threshold voltage distribution of the memory cells is presented by a dotted line D2 (which is also referred to as a threshold voltage distribution D2) illustrated in FIG. 3. Then, the verification voltage $V_{verify}$ is used to verify the memory cells to determine whether the memory cells are all in the accurate storage state (i.e., the storage bit is "0"). Here, since the memory cells are not in the storage state with the storage bit of "0", the currently applied initial program voltage $V_i$ is added with the ISPP adjustment value $\Delta V$ as a new program voltage $V_{r1}$, and the memory cells are programmed again according to the new program voltage $V_{r1}$ and a program voltage pulse time $\Delta T$. A threshold voltage distribution of the memory cells which are re-programmed by using the program voltage $V_{r1}$ is presented by using a dotted line D3 (which is also referred to as a threshold voltage distribution D3) illustrate in FIG. 3. In this way, when a threshold voltage distribution of the memory cells programmed by using the program voltage $V_{r2}$ is presented by a solid line D4 (which is also referred to as a threshold voltage distribution D4) illustrated in FIG. 3, and the memory cells are all in the accurate storage state (i.e., the storage bit is "0"), the programming operation of writing the data including the bit of "0" to the memory cells is completed.

However, the above programming of the memory cells by using the ISPP model may result in the threshold voltage distribution of the memory cells being overly increased. For instance, with reference to FIG. 2 and FIG. 3, a width of the threshold voltage distribution D1 of the memory cells is smaller than a width of threshold voltage distribution D4 of the memory cells. Such phenomenon appears because each memory cell has different characteristics, but is applied with the same program voltage, such that difference among the ranges of the threshold voltages of the memory cells dramatically becomes wider.

Moreover, as described above, programming the memory cells by using the normal ISPP model may also result in the memory cells being over-programmed. For instance, in the exemplary embodiment of FIG. 3, when the memory cells performed with the programming operation have the threshold voltage distribution D3, programming the memory cells having the threshold voltage distribution D3 by applying the same program voltage $V_{r2}$ cause some memory cells among the memory cells whose threshold voltages exceed the verification voltage $V_{verify}$ keep to be applied with the program voltage (this process may be referred to as over-programming). The over-programmed memory cells having threshold voltages higher than the verification voltage $V_{verify}$, but being applied with the program voltage $V_{r2}$ may have threshold voltages of higher levels. In other words, as described above, the programming operation is performed overly on the over-programmed memory cells because the program voltage is continuously applied. The over-programming causes unnecessary wear to the memory cells, increases degradation of the memory cells and thereby shortens the lifespan of the memory storage device.

Accordingly, in a memory programming method, and a memory control circuit unit and a memory storage device using the method provided in the below exemplary embodiments, a threshold voltage distribution status of a plurality of memory cells in the flash memory are identified, and the memory cells are grouped into a plurality of programming groups according to the threshold voltage distribution status of the memory cells, such that each programming group is applied with a corresponding program voltage. In this way, the memory cells may be effectively prevented from being over-programmed to extend the lifespan of the memory storage device.

Generally, a memory storage device (i.e., a memory storage system) includes a rewritable non-volatile memory module and a controller (i.e., a memory control circuit unit). The memory storage device is usually used with a host system, such that the host system can write data into or read data from the memory storage device.

Figure 4:
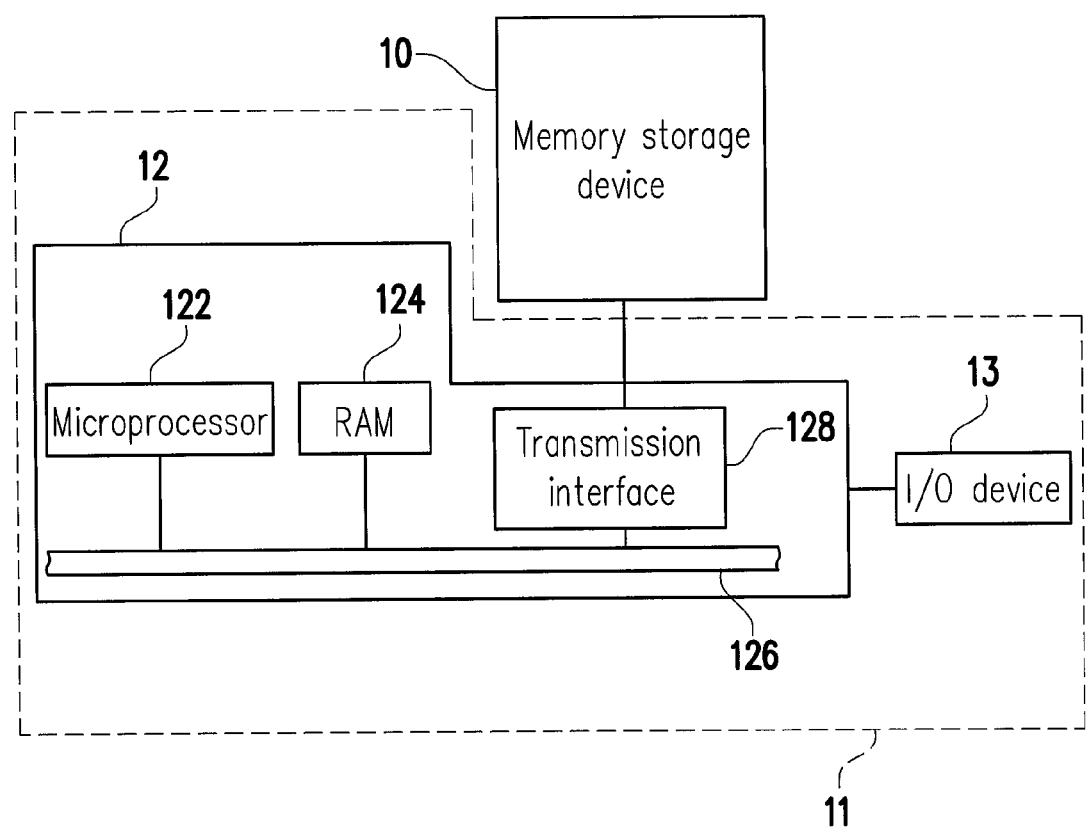
FIG. 4 is a schematic diagram illustrating a host system and a memory storage device according to an exemplary embodiment of the present invention.
Figure 5:
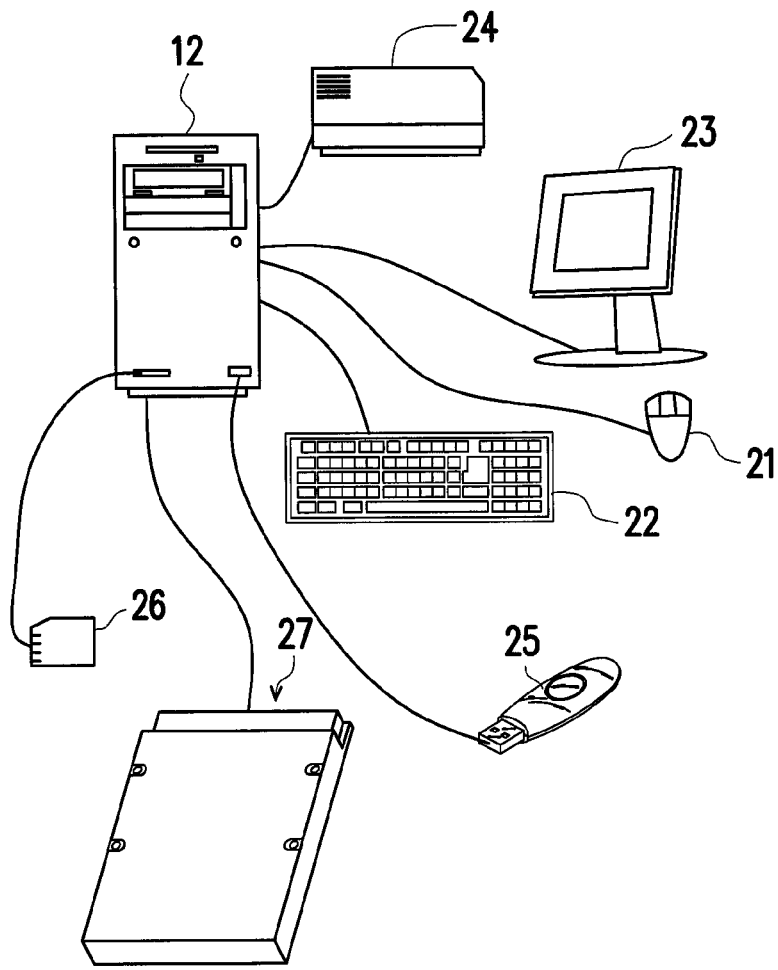
FIG. 5 is a schematic diagram illustrating a computer, an input/output (I/O) device and a memory storage device according to an exemplary embodiment of the present invention.

FIG. 4 is a schematic diagram illustrating a host system and a memory storage device according to an exemplary embodiment of the present invention. FIG. 5 is a schematic diagram illustrating a computer, an input/output (I/O) device and a memory storage device according to an exemplary embodiment of the present invention.

With reference to FIG. 4, a host system 11 typically includes a computer 12 and an input/output (I/O) device 13. The computer 12 includes a microprocessor 122, a random access memory (RAM) 124, a system bus 126 and a data transmission interface 128. The I/O device 13 includes a mouse 21, a keyboard 22, a display 23 and a printer 24 illustrated in FIG. 5. It may be understood that the I/O device 13 is not limited to the devices illustrated in FIG. 5, and the I/O device 13 may further include other devices.

In an exemplary embodiment, the memory storage device 10 is coupled to other devices of the host system 11 through the data transmission interface 128. Through the operation of the microprocessor 122, the RAM 124 and the I/O device 13, data can be written into or read from the memory storage device 10. For instance, the memory storage device 10 may be a rewritable non-volatile memory storage device, such as a flash drive 25, a memory card 26 or a solid state drive (SSD) 27 illustrated in FIG. 5.

Figure 6:
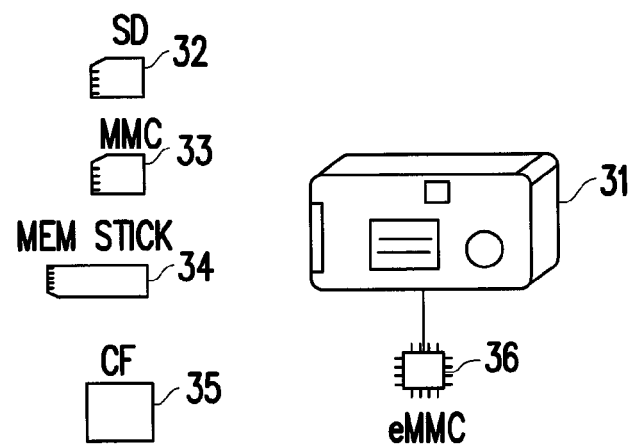
FIG. 6 is a schematic diagram illustrating a host system and a memory storage device according to an exemplary embodiment of the present invention.

FIG. 6 is a schematic diagram illustrating a host system and a memory storage device according to an exemplary embodiment of the present invention.

Generally speaking, the host system 11 may be any system operated with the memory storage device 10 to store data. Even though the host system 11 is described as a computer system in the present exemplary embodiment, the host system 11, in another exemplary embodiment, may be a digital camera, a video camera, a communication device, an audio player, or a video player. For instance, in case the host system is a digital camera (video camera) 31, the non-volatile memory storage device is a secure digital (SD) card 32, a multi media card (MMC) card 33, a memory stick (MS) 34, a compact flash (CF) card 35 or an embedded storage device 36 (illustrated in FIG. 6). The embedded storage device 36 may include an embedded MMC (eMMC). It may be mentioned that the eMMC is directly coupled to the substrate of the host system.

Figure 7:
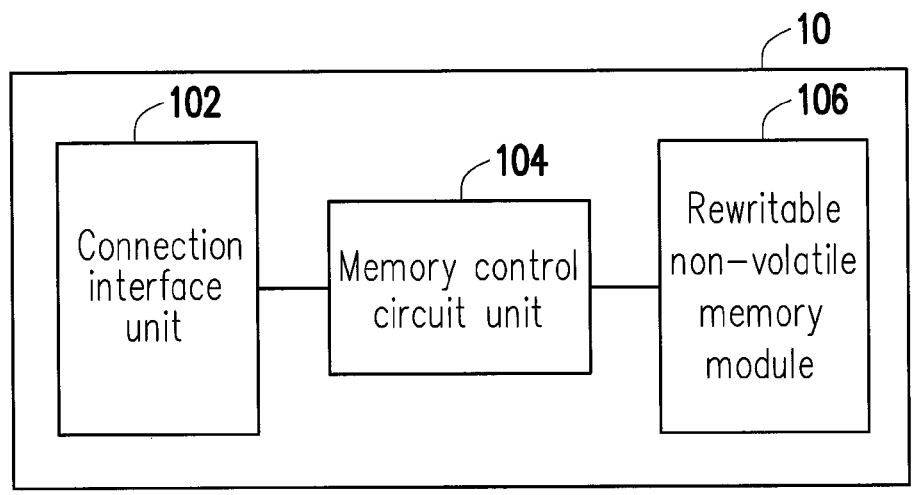
FIG. 7 is a schematic block diagram of the memory storage device depicted in FIG. 4.

FIG. 7 is a schematic block diagram of the memory storage device depicted in FIG. 4.

With reference to FIG. 7, the memory storage device 10 includes a connection interface unit 102, a memory control circuit unit 104 and a rewritable non-volatile memory module 106.

In the present exemplary embodiment, the connection interface unit 102 complies with the serial advanced technology attachment (SATA) standard. However, the present invention is not limited thereto, and the connection interface unit 402 may also comply with the Parallel Advanced Technology Attachment (PATA) standard, the Institute of Electrical and Electronic Engineers (IEEE) 1394 standard, the peripheral component interconnect express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the memory stick (MS) interface standard, the multi-media card (MMC) interface standard, the Embedded Multimedia Card (eMMC) interface standard, the Universal Flash Storage (UFS) interface standard, the compact flash (CF) interface standard, the integrated device electronics (IDE) standard, or other suitable standards. The connection interface unit 102 may be package with the memory control circuit unit 104 in one chip or laid outside a chip having the memory control circuit unit 104.

The memory control circuit unit 104 is configured to execute a plurality of logic gates or control commands which are implemented in a hardware form or in a firmware form and perform operations such as data writing, reading or erasing in the rewritable non-volatile memory module 106 according to the command of the host system 11.

The rewritable non-volatile memory module 106 is coupled to the memory control circuit unit 404 and configured to store data written by the host system 11. The rewritable non-volatile memory module 106 may be a single level cell (SLC) NAND flash memory module, a multi level cell (MLC) NAND flash memory module (i.e., a flash memory module capable of storing data of 2 bits in one memory cell), a triple-level cell (TLC) NAND flash memory module (i.e., a flash memory module capable of storing data of 3 bits in one memory cell), other flash memory modules, or other memory modules having the same characteristics.

Figure 8:
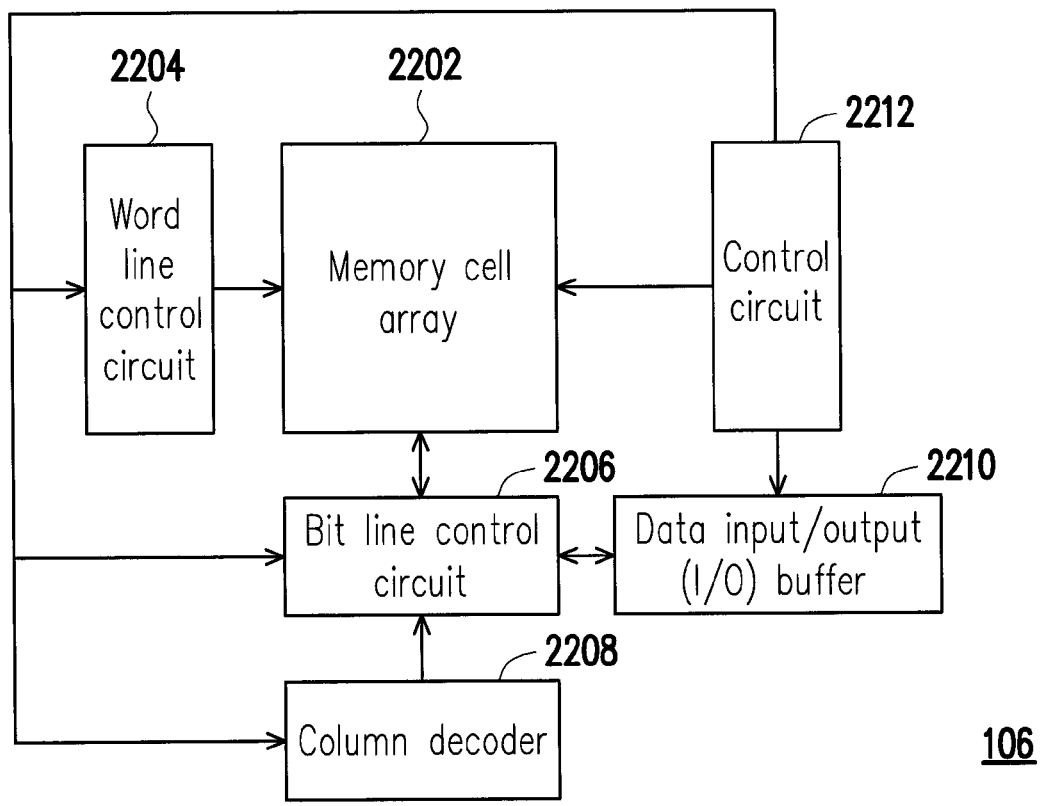
FIG. 8 is a schematic block diagram illustrating a rewritable non-volatile memory module according to an exemplary embodiment of the present invention.

FIG. 8 is a schematic block diagram illustrating a rewritable non-volatile memory module according to an exemplary embodiment of the present invention.

With reference to FIG. 8, the rewritable non-volatile memory module 106 includes a memory cell array 2202, a word line control circuit 2204, a bit line control circuit 2206, a column decoder 2208, a data input/output (I/O) buffer 2210, and a control circuit 2212.

Figure 9:
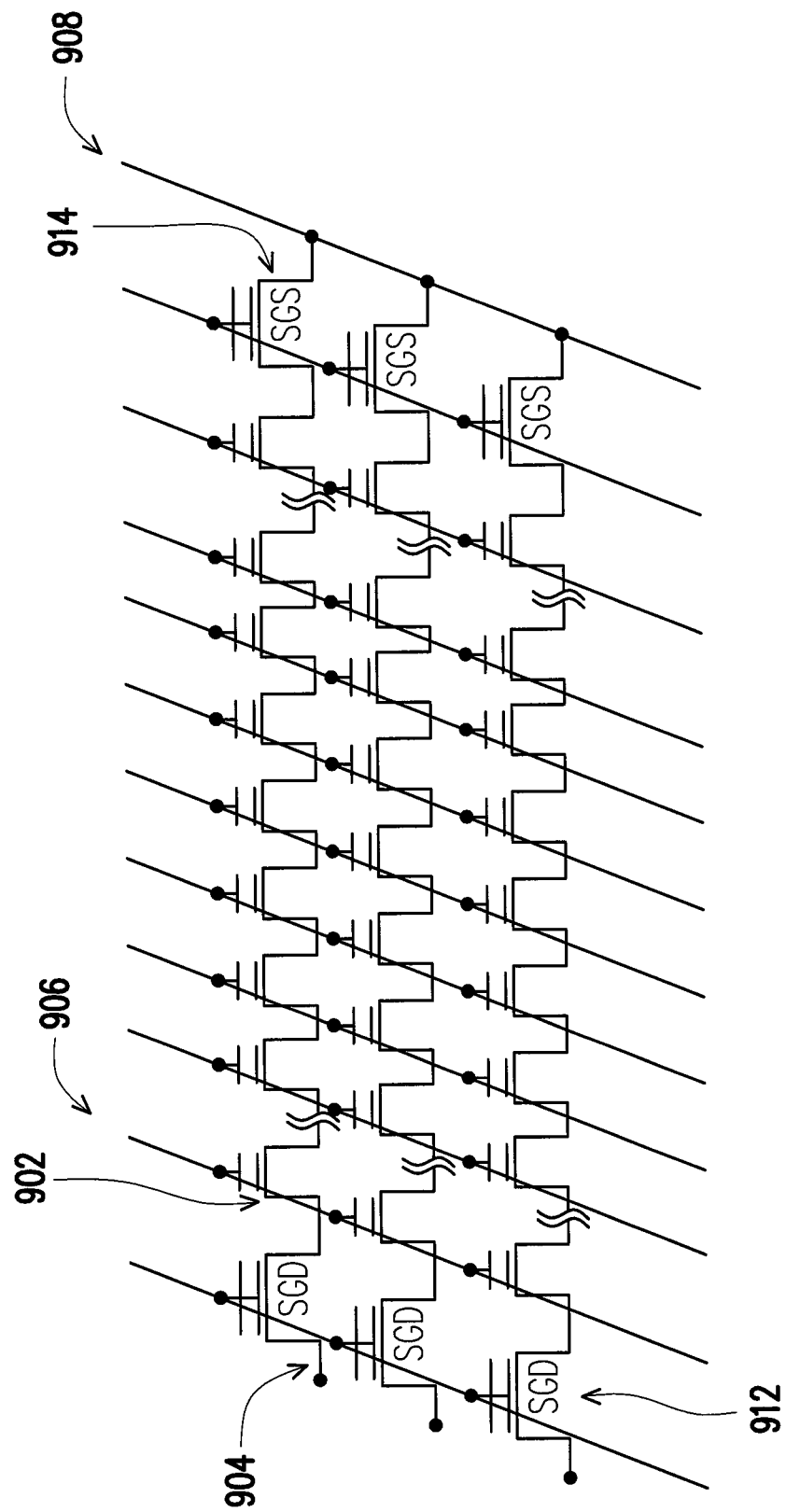
FIG. 9 is a schematic diagram illustrating a memory cell array according to an exemplary embodiment of the present invention.

FIG. 9 is a schematic diagram illustrating a memory cell array according to an exemplary embodiment of the present invention.

With reference to FIG. 8 and FIG. 9, the memory cell array 2202 includes a plurality of select gate drain (SGD) transistors 912 and a plurality of select gate source (SGS) transistors 914 disposed on a plurality of substrates, a plurality of bit lines 904, a plurality of word lines 906, a plurality of source lines connected with the memory cells 902 and a plurality of memory cells 902 for storing data (as illustrated in FIG. 9). The memory cells 902 are disposed on the cross points of the bit lines 904 and the word lines 906 in an array. When a write command or a read command is received from the memory control circuit unit 104, the control circuit 2212 controls the word line control circuit 2204, the bit line control circuit 2206, the column decoder 2208, and the data I/O buffer 2210 to write data into the memory cell array 2202 or read data from the memory cell array 2202. The word line control circuit 2204 is configured to control the voltage applied to the word lines 906, the bit line control circuit 2206 is configured to control the voltage applied to the bit lines 904, the column decoder 2208 selects the corresponding bit line according to the decoding column address in the command, and the data I/O buffer 2210 is configured to store the data temporarily.

As described above, the memory cells of the rewritable non-volatile memory module 106 are programmed, by using a variety of program voltages, to a variety of storage states to accurately store bit values of write data. Specifically, each memory cell in the memory cell array 2202 has a plurality of storage states, and the storage states are distinguished by a plurality of read voltages.

Figure 10:
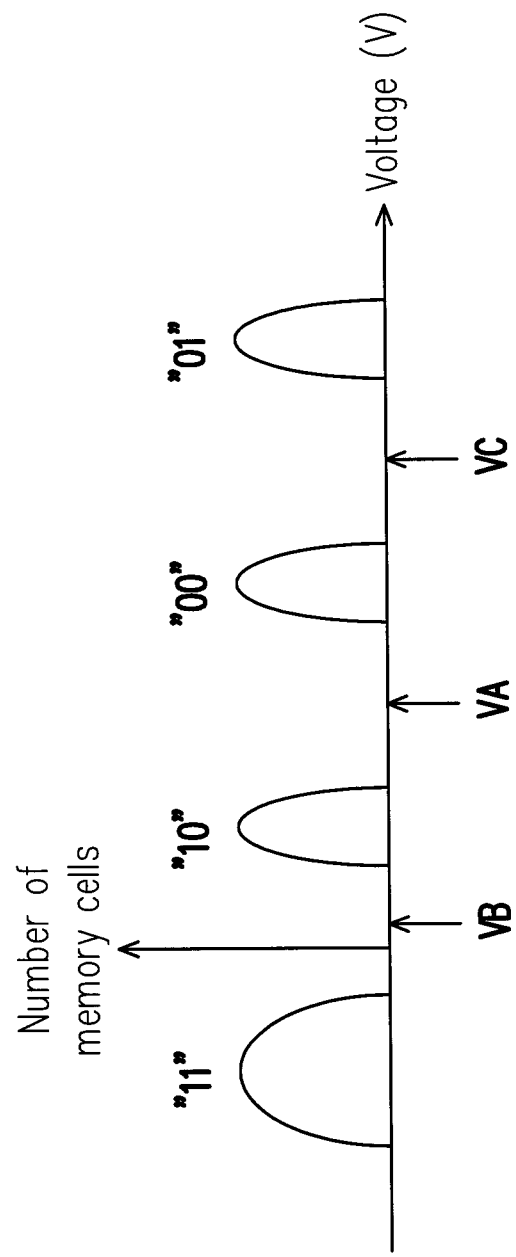
FIG. 10 is a schematic graph of a threshold voltage distribution corresponding to the write data stored in the memory cell array according to an exemplary embodiment of the present invention.

FIG. 10 is a schematic graph of a threshold voltage distribution corresponding to the write data stored in the memory cell array according to an exemplary embodiment of the present invention.

With reference to FIG. 10, taking an MLC NAND flash memory as an example, the threshold voltage in each memory cell may be categorized into 4 storage states according to a default threshold voltage VA, a default threshold voltage VB, and a default threshold voltage VC, and the storage states respectively represent storage bits, "11", "10", "00" and "01". Thus, in the present exemplary embodiment, each memory cell may store data of 2 bits. It may be understood that the threshold voltages and the storage states corresponding thereto illustrated in FIG. 10 are merely examples. In another exemplary embodiment, the corresponding relationship between the threshold voltages and the storage states may have an arrangement as "11", "10", "01" and "00" along with the increase in the threshold voltages. Alternatively, in another exemplary embodiment, the corresponding relationship between the threshold voltages and the storage states may also be set according to actual usage, which is not limited to the above.

In the example that each memory cells may store data of 2 bits, the memory cells on the same word line form two physical programming units (i.e., a lower physical programming unit and an upper physical programming unit). Additionally, a plurality of physical programming units in the memory cell array 2202 forms a physical erasing unit, and a physical erasing unit is the smallest unit for erasing. Namely, each physical erasing unit includes the least number of memory cells to be erased altogether.

The data write (i.e., program) process of the memory cell array 2202 includes applying a voltage (e.g., a gate voltage) to a certain terminal. For example, a program voltage (i.e., write voltage) may be controlled to change the electron volume in a charge-trapping layer in the gate, so that the conduction state of the channel of a memory cell is changed to present the different storage states. For instance, when the data of the lower physical programming unit is "1", and the data of the upper physical programming unit is "1", the control circuit 2212 controls the word line control circuit 2204 to not change the program voltage in the memory cell, so as to keep the storage state of the memory cell as "11". When the data of the lower physical programming unit is "1", and the data of the upper physical programming unit is "0", the control circuit 2212 controls the word line control circuit 2204 to change the program voltage in the memory cell such that the storage state of the memory cell is changed to "10". When the data of the lower physical programming unit is "0", and the data of the upper physical programming unit is "0", the control circuit 2212 controls the word line control circuit 2204 to change the program voltage in the memory cell such that the storage state of the memory cell is changed to "00". When the data of the lower physical programming unit is "0", and the data of the upper physical programming unit is also 1, the control circuit 2212 controls the word line control circuit 2204 to change the program voltage in the memory cell such that the storage state of the memory cell is changed to "01".

Similarly, in an example that each memory cell is used to store data of 1 bit, (e.g., in an LC NAND flash memory module), the memory cells on the same word line form one physical programming unit. The storage state of the unprogrammed memory cells is "1". To write data "1" into a memory cell, the control circuit 2212 controls the word line control circuit 2204 to keep the storage state of the memory cell as "1". In contrast, to write data "0", the control circuit 2212 controls the word line control circuit 2204 to change the program voltage in the memory cell such that the storage state of the memory cell is changed to "0". Namely, the memory cell is programmed to be the memory cell with the storage bit of "0" through the programming operation.

In order to conveniently describe the memory programming method used in the present invention, it is assumed that each memory cell in the rewritable non-volatile memory module 106 can store 1 bit, and the memory control circuit unit 104 is intended to store write data (whose bit values are all "0") into a plurality of unprogrammed memory cells in the rewritable non-volatile memory module 106 whose storage states are all "1".

Figure 11:
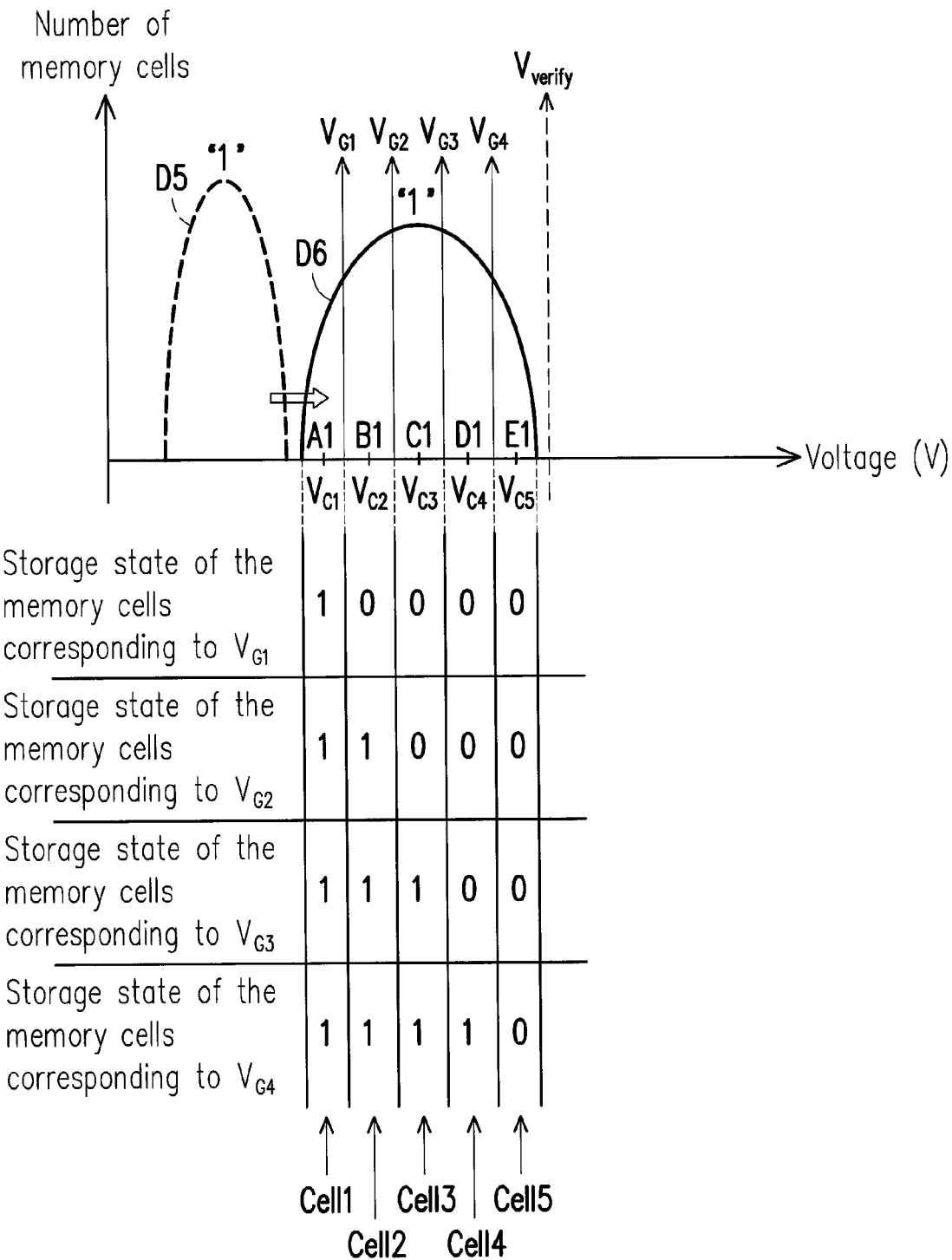
FIG. 11 is a schematic diagram of grouping the memory cells according to an exemplary embodiment of the present invention.

FIG. 11 is a schematic diagram of grouping the memory cells according to an exemplary embodiment of the present invention.

With reference to FIG. 11, in the present exemplary embodiment, the memory control circuit unit 104 instructs the rewritable non-volatile memory module 106 to use one or more program voltages to perform a programming process (also referred to as a first programming process) on a plurality of memory cells (also referred to as target memory cells) according to write data (whose bit values are all "0") to be stored and obtains a programming result (also referred to as a first programming result). For instance, a threshold voltage distribution of the target memory cells before being programmed is presented by a dotted line D5 (i.e., a threshold voltage distribution D5) illustrated in FIG. 11 and a storage state thereof is "1". After the first programming process is performed, the threshold voltage distribution of the target memory cells is changed to be presented by a solid line D6 (i.e., a threshold voltage distribution D6) illustrated in FIG. 11. In other words, the process of changing the threshold voltage distribution of the target memory cells from one distribution to another distribution may be referred to as a programming process. Additionally, in the present exemplary embodiment, the first programming process refers to an initialization process in the ISPP model, and a program voltage used in the first programming process is the initial program voltage (e.g., the initial program voltage $V_i$ illustrated in FIG. 2). However, in another exemplary embodiment, the first programming process may also refer to any programming process in the ISPP model, and the number of the program voltages used in each programming process is not limited.

In the present exemplary embodiment, the memory control circuit unit 104 transmit a verification instruction to the rewritable non-volatile memory module 106. The verification instruction is configured to instruct the rewritable non-volatile memory module 106 to apply the verification voltage $V_{verify}$ to the target memory cells to determine whether the storage states of the target memory cells are all in the storage state (which is also referred to as the accurate storage state) corresponding to the write data. If the storage states of the target memory cells are all in the accurate storage state corresponding to the write data, the memory control circuit unit 104 determines that the programming result of the previously performed programming process meets a predetermined programming result. If the storage states of target memory cells are not all in the accurate storage state corresponding to the write data, the memory control circuit unit 104 determines that the programming result of the previously performed programming process does not meet the predetermined programming result. Additionally, the voltage level of the verification voltage $V_{verify}$ may be determined by the memory control circuit unit 104 or by the rewritable non-volatile memory module 106 (e.g., the control circuit 2212) itself.

Referring to FIG. 11, since the threshold voltage distribution D6 of the target memory cells on which the first programming process performs is smaller than the verification voltage $V_{verify}$, the storage states of the target memory cells read by applying the verification voltage $V_{verify}$ are all "1", which does not meet the write data with all "0". Accordingly, the memory control circuit unit 104 determines that the first programming result of the target memory cells does not meet the predetermined programming result.

In the present exemplary embodiment, if determining that the first programming result of the target memory cells does not meet the predetermined programming result, the memory control circuit unit 104 groups the target memory cells into a plurality of programming groups and then applies different program voltages to different programming groups in a subsequent programming process (also referred to as a second programming process), so as to try to program the target memory cells to the accurate storage state corresponding to the write data.

In the present exemplary embodiment, the memory control circuit unit 104 transmits an instruction (i.e., grouping instruction) to the rewritable non-volatile memory module 106, in which the grouping instruction is configured to instruct the rewritable non-volatile memory module 106 to provide N different grouping voltages to the target memory cells to obtain storage state information of the target memory cells. For instance, after receiving the grouping instruction, the rewritable non-volatile memory module 106 (e.g., the control circuit 2212) apply one or more grouping voltages to the target memory cells according to the grouping instruction, in which N may be 1 to 4, or any positive integer. Therein, the storage state information of the target memory cells may indicate the threshold voltage distributions of the target memory cells. For instance, according to the storage state information of a certain target memory cell, the memory control circuit unit 104 may obtain a threshold voltage distribution status of the target memory cell. Taking the exemplary embodiment illustrated in FIG. 11 as an example, memory control circuit unit 104 instructs to group the target memory cells by using 4 grouping voltages VG1 to VG4. Therein, the grouping voltages $V_{G1}$ to $V_{G4}$ fall within a range included in the threshold voltage distribution of the target memory cells. The grouping voltages $V_{G1}$ to $V_{G4}$ may be sequentially applied to the target memory cells according to levels thereof (e.g., from the smallest to the largest) or other rule. Additionally, the level of each of the grouping voltages $V_{G1}$ to $V_{G4}$ may be determined by the memory control circuit unit 104 or the rewritable non-volatile memory module 106 (e.g., the control circuit 2212).

With reference to FIG. 11, after instructing the rewritable non-volatile memory module 106 to apply the grouping voltage $V_{G1}$ to the target memory cells, the memory control circuit unit 104 may obtain storage states of the target memory cells corresponding to the grouping voltage $V_{G1}$. For instance, the memory control circuit unit 104 may obtain the target memory cells with the storage state "0" corresponding to the grouping voltage $V_{G1}$ and the target memory cells with the storage state "1" corresponding to the grouping voltage $V_{G1}$. For instance, the memory control circuit unit 104 may identify that the target memory cells with the storage states "0" as the target memory cells having threshold voltages greater than the grouping voltage $V_{G1}$ and identify that the target memory cells with the storage state "1" as the target memory cells having threshold voltages smaller than the grouping voltage $V_{G1}$. Likewise, after applying the grouping voltages $V_{G2}$ to $V_{G4}$ to the target memory cells, the memory control circuit unit 104 may further obtain the storage states of the target memory cells corresponding to the grouping voltages $V_{G2}$ to $V_{G4}$, so as to group the target memory cells into programming groups A1 to E1.

In the exemplary embodiment illustrated in FIG. 11, threshold voltage distribution ranges of the programming groups A1 to E1 are different. Additionally, a threshold voltage of a memory cell in the programming groups A1 is smaller than a threshold voltage of a memory cell in the programming group B1; the threshold voltage of the memory cell in the programming group B1 is smaller than a threshold voltage of a memory cell in the programming group C1; the threshold voltage of the memory cell in the programming group C1 is smaller than a threshold voltage of a memory cell in the programming group D1; the threshold voltage of the memory cells in the programming group D1 is smaller than a threshold voltage of a memory cell in the programming group E1.

It is to be mentioned that in the exemplary embodiments above, the memory control circuit unit 104 instructs to group the target memory cells by using 4 grouping voltages and thus, obtains 5 programming groups. However, in another exemplary embodiment, different numbers of the grouping voltages result in different numbers of grouped programming groups. For instance, if only one grouping voltage is used to group the target memory cells, the target memory cells may be grouped into only two programming groups, and so on, likewise.

FIG. 12 is a schematic diagram of determining the programming groups according to an exemplary embodiment of the present invention.

With reference to FIG. 11 and FIG. 12, it is assumed that the target memory cells includes memory cells Cell1 to Cell5. A level of a voltage (or threshold voltage) of the memory cell Cell1 is $V_{C1}$, a level of a voltage (or threshold voltage) of the memory cell Cell2 is $V_{C2}$, a level of a voltage (or threshold voltage) of the memory cell Cell3 is $V_{C3}$, a level of a voltage (or threshold voltage) of the memory cell Cell4 is $V_{C4}$, and a level of a voltage (or threshold voltage) of the memory cell Cell5 is $V_{C5}$. After the grouping voltages $V_{G1}$ to $V_{G4}$ are applied to the target memory cells, the memory control circuit unit 104 may obtain, for example, a storage state (("1", "1", "1", "1") in sequence) of the memory cell Cell1 corresponding to the grouping voltages $V_{G1}$ to $V_{G4}$, a storage state (("0", "1", "1", "1") in sequence) of the memory cell Cell2 corresponding to the grouping voltages $V_{G1}$ to $V_{G4}$, a storage states (("0", "0", "1", "1") in sequence) of the memory cell Cell3 corresponding to the grouping voltages $V_{G1}$ to $V_{G4}$, a storage states (("0", "0", "0", "1") in sequence) of the memory cell Cell4 corresponding to the grouping voltages $V_{G1}$ to $V_{G4}$, and a storage states (("0", "0", "0", "0") in sequence) of the memory cell Cell5 corresponding to the grouping voltages $V_{G1}$ to $V_{G4}$. The memory cell Cell1 is grouped to the programming group A1 according to the storage state of the memory cell Cell1 corresponding to the grouping voltages $V_{G1}$ to $V_{G4}$; the memory cell Cell2 is grouped to the programming group B1 according to the storage state of the memory cell Cell2 corresponding to the grouping voltages $V_{G1}$ to $V_{G4}$; the memory cell Cell3 is grouped to the programming group C1 according to the storage state of the memory cell Cell3 corresponding to the grouping voltages $V_{G1}$ to $V_{G4}$; the memory cell Cell4 is grouped to the programming group D1 according to the storage state of the memory cell Cell4 corresponding to the grouping voltages $V_{G1}$ to $V_{G4}$; and the memory cell Cell5 is grouped to the programming group E1 according to the storage state of the memory cell Cell5 corresponding to the grouping voltages $V_{G1}$ to $V_{G4}$.

The memory control circuit unit 104 may perform the above grouping operation through a look-up table. For instance, the storage state of the memory cell Cell1 corresponding to the grouping voltages $V_{G1}$ to $V_{G4}$ is input to a look-up table to obtain that the memory cell Cell1 belongs to the programming group A1. Alternatively, the memory control circuit unit 104 may also calculate a number of "0" or "1" in a storage state of a certain target memory cell in response to the grouping voltages $V_{G1}$ to $V_{G4}$ and then determine the programming group that the target memory cell belongs to. For instance, the storage state ("1", "1", "1", "1") of the memory cell Cell1 in response to the grouping voltages $V_{G1}$ to $V_{G4}$ does not have any "0", and thus, the memory control circuit unit 104 may group the memory cell Cell1 into the programming group A1.

Referring to FIG. 11, according to the programming groups A1 to E1, a programming speed of the memory cells in the programming group E1 in response to the first programming process is the highest, while a programming speed of the memory cells in the programming group A1 is the lowest. The programming speed of the memory cells in the programming group E1 is higher than a programming speed of the memory cells in the programming group D1, the programming speed of the memory cells in the programming group D1 is higher than a programming speed of the memory cells in the programming group C1, and so on. Thus, in the subsequent programming process (i.e., the second programming process), if a program voltage with a lower level is applied to the memory cells of a programming group with a higher writing speed, and another program voltage with a higher level is applied to the memory cells of another programming group with a higher speed, the threshold voltage distribution ranges of the target memory cells after the second programming process may be more concentrated. Moreover, in another exemplary embodiment, the threshold voltage distribution ranges of the programmed target memory cells may also be narrowed by means of adjusting the program voltage pulse time or other parameters related to the ISPP model.

In an exemplary embodiment, the memory control circuit unit 104 may record grouping information with respect to each memory cell being grouped each time or the last time. Thereby, when the memory cells are programmed afterwards, the grouping information may be directly used for grouping the memory cells to speed up the grouping operation.

As described above, after grouping the target memory cells into the plurality of programming groups, the memory control circuit unit 104 may instruct to apply different program voltages to different programming groups according to the grouped programming groups. The memory programming method of the present invention will be described with reference to FIG. 13 to FIG. 18 hereinafter. It may be noted that in FIG. 13 to FIG. 18, dotted bars are used to present the program voltages, a slashed bar is used to present the verification voltage, and blank bars are used to present the grouping voltages.

FIG. 13 through FIG. 16 are schematic graphs of a memory programming operation according to an exemplary embodiment of the present invention.

Figure 13:
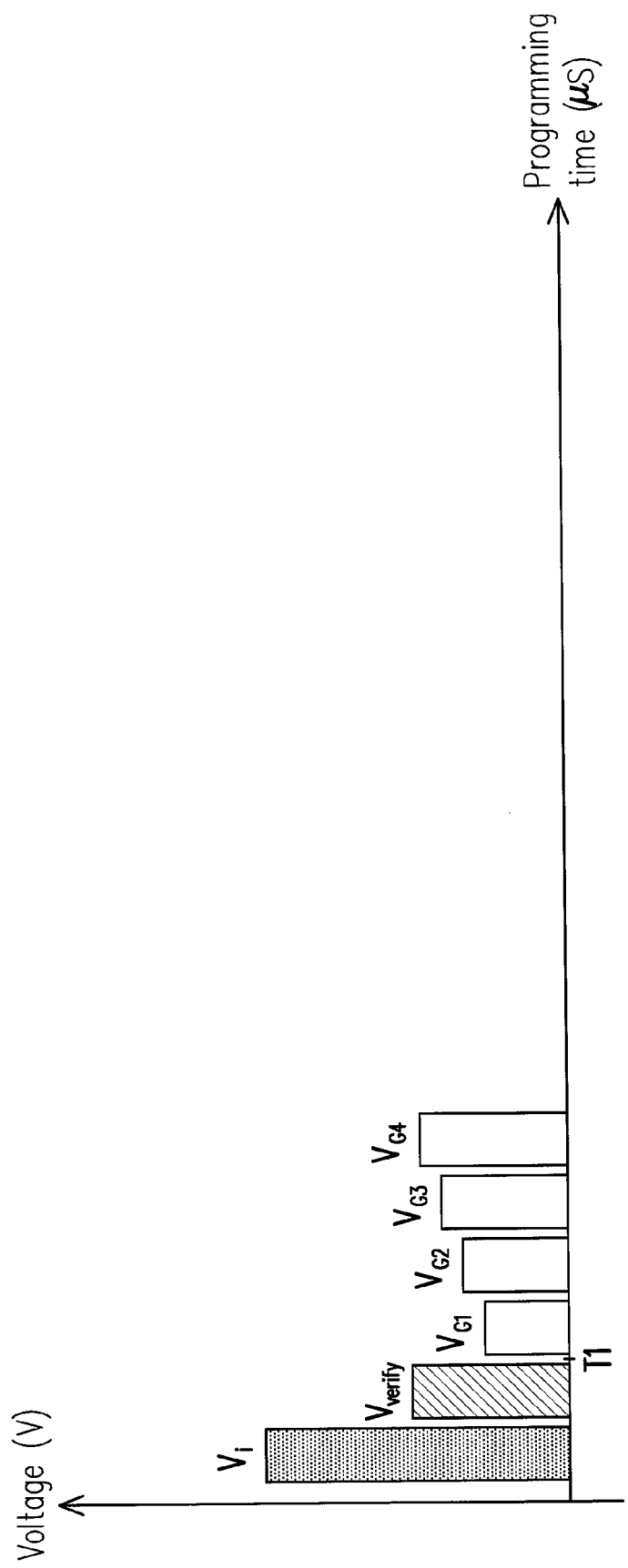
FIG. 13 through FIG. 16 are schematic graphs of a memory programming operation according to an exemplary embodiment of the present invention.

With reference to FIG. 13, it is assumed that in the first programming process, the memory control circuit unit 104 instructs the rewritable non-volatile memory module 106 to program the target memory cells by using the initial program voltage $V_i$. Then, the rewritable non-volatile memory module 106 applies the verification voltage $V_{verify}$ to the target memory cells, and the memory control circuit unit 104 determines whether the first programming result of the first programming process meets a predetermined programming result. For instance, the memory control circuit unit 104 may determine whether all the storage states of the target memory cells are in the accurate storage state corresponding to the write data. If all the storage states of the target memory cells are not in the accurate storage state corresponding to the write data, the memory control circuit unit 104 instructs the rewritable non-volatile memory module 106 to group the target memory cells by using the grouping voltages $V_{G1}$ to $V_{G4}$. It may be noted that the grouping voltages $V_{G1}$ to $V_{G4}$ has different voltage levels. For instance, the grouping voltage $V_{G1}$ may be smaller than the grouping voltage $V_{G2}$, the grouping voltage $V_{G2}$ may be smaller than the grouping voltage $V_{G3}$, and the grouping voltage $V_{G3}$ may be smaller than the grouping voltage $V_{G4}$.

Figure 14:
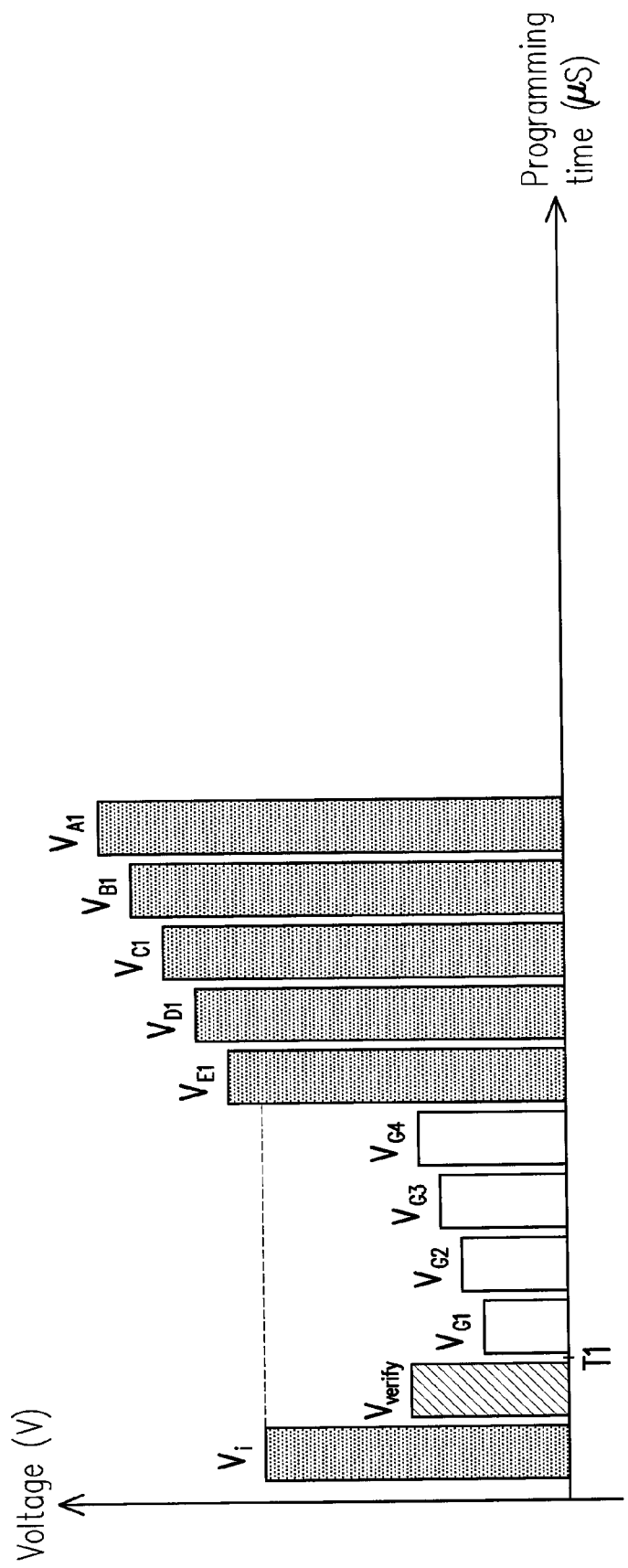

With reference to both FIG. 11 and FIG. 14, it is assumed that the memory control circuit unit 104 instructs to program the target memory cells into programming groups A1 to E1 by using the grouping voltages $V_{G1}$ to $V_{G4}$, the memory control circuit unit 104 instructs the rewritable non-volatile memory module 106 to perform the second programming process on the target memory cells by using a plurality of write voltages (also referred to as program voltages) respectively corresponding to the programming groups A1 to E1. For instance, in the second programming process, the rewritable non-volatile memory module 106 may apply a program voltage $V_{A1}$ to the target memory cells in the programming group A1, apply a program voltage $V_{B1}$ to the target memory cells in the programming group B1, apply a program voltage $V_{C1}$ to the target memory cells in the programming group C1, apply a program voltage $V_{D1}$ to the target memory cells in the programming group D1, and apply a program voltage $V_{E1}$ to the target memory cells in the programming group E1. However, in another exemplary embodiment, the first programming process and the second programming process may also refer to any two continuous or discontinuous programming processes in the ISPP model, which is not limited to the above.

It may be noted that in the present exemplary embodiment, the memory control circuit unit 104 instructs the rewritable non-volatile memory module 106 to apply the program voltages $V_{A1}$ to $V_{E1}$ with different voltage levels by looking up in a look-up table according to the threshold voltage distribution of each of the programming groups A1 to E1. According to looking-up result, the memory control circuit unit 104 instructs the rewritable non-volatile memory module 106 to apply a high-level program voltage to the target memory cells in the programming groups with a lower threshold voltage distribution. For instance, the threshold voltages of the target memory cells in the programming group E1 is greater than the threshold voltages of the target memory cells in the programming group D1, and thus, the program voltage $V_{E1}$ applied to the programming group E1 is smaller than the program voltage $V_{D1}$ applied to the programming group D1. Likewise, the program voltage $V_{D1}$ applied to the programming group D1 is smaller than the program voltage $V_{C1}$ applied to the programming group C1, the program voltage $V_{C1}$ applied to the programming group C1 is smaller than the program voltage $V_{B1}$ applied to the programming group B1, and the program voltage $V_{B1}$ applied to the programming group B1 is smaller than the program voltage $V_{A1}$ applied to the programming group A1. In addition, the program voltages used in the second programming process is greater than the program voltages used in the first programming process. For instance, referring to FIG. 14, the program voltage $V_{E1}$ is greater than the initial program voltage $V_i$. Additionally, in another exemplary embodiment, the program voltages $V_{A1}$ to $V_{E1}$ may also be obtained by modifying the previously applied program voltages in previous programming process according to the threshold voltage distribution of each of the programming groups A1 to E1.

Figure 15:
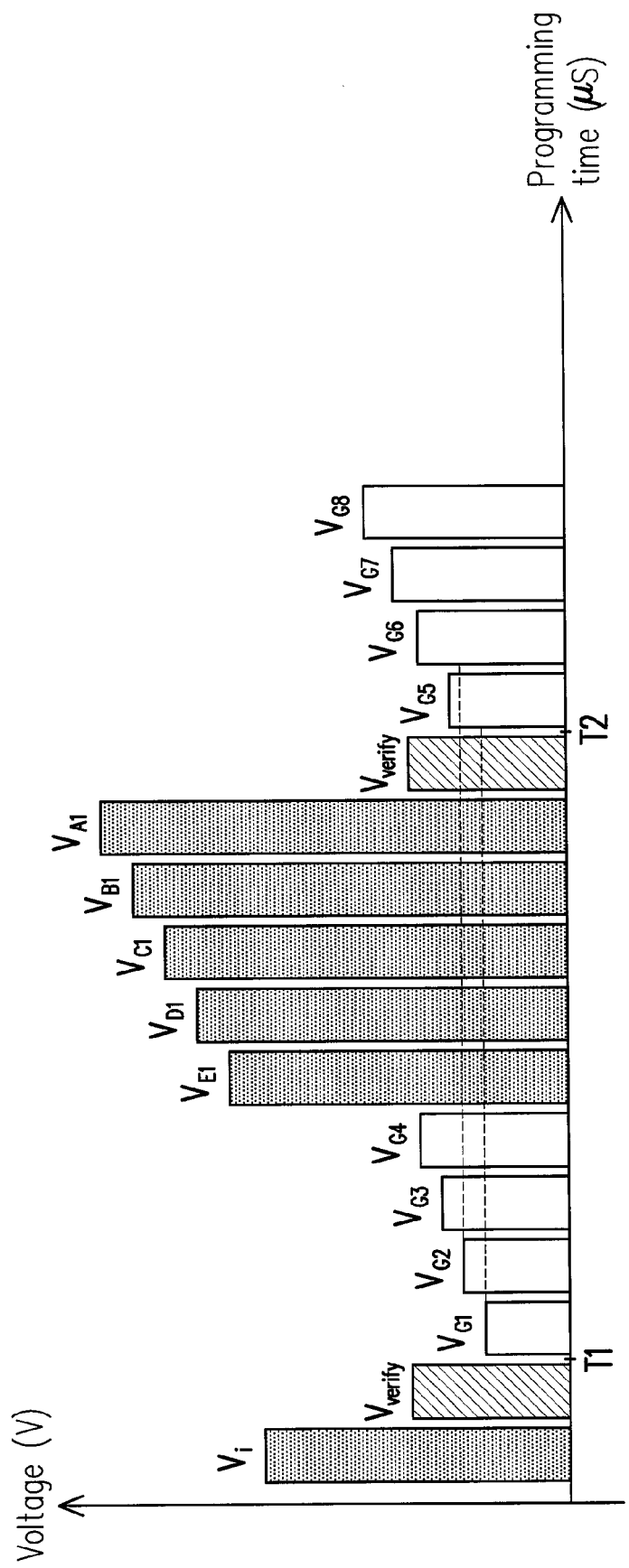

With reference to FIG. 15, after performing the second programming process on the target memory cells, the rewritable non-volatile memory module 106 applies the verification voltage $V_{verify}$ to the target memory cells, and the memory control circuit unit 104 determines whether a programming result (also referred to as a second programming result) of the second programming process meets the predetermined programming result corresponding to the write data. If the second programming result does not meet the predetermined programming result, the memory control circuit unit 104 continues to perform another grouping operation on the target memory cells. For instance, the memory control circuit unit 104 may instruct the rewritable non-volatile memory module 106 to apply grouping voltages $V_{G5}$ to $V_{G8}$ to the target memory cells to re-group the target memory cells. It may be noted that after the second programming process is performed on the target memory cells, the threshold voltages of the target memory cells are increased, and thus, the grouping voltages $V_{G5}$ to $V_{G8}$ are correspondingly increased. For instance, a voltage level of the grouping voltage $V_{G5}$ is greater than a voltage level of the grouping voltage $V_{G1}$; the voltage level of the grouping voltage $V_{G6}$ is greater than a voltage level of the grouping voltage $V_{G2}$; the voltage level of the grouping voltage $V_{G4}$ is greater than a voltage level of the grouping voltage $V_{G3}$; and the voltage level of the grouping voltage $V_{G8}$ is greater than a voltage level of the grouping voltage $V_{G4}$. Details with respect to how to group the target memory cells has been described above and will not be repeated. In addition, the number of the grouping voltages $V_{G5}$ to $V_{G8}$ may also be more or fewer, which is not limited in the present invention.

Figure 16:
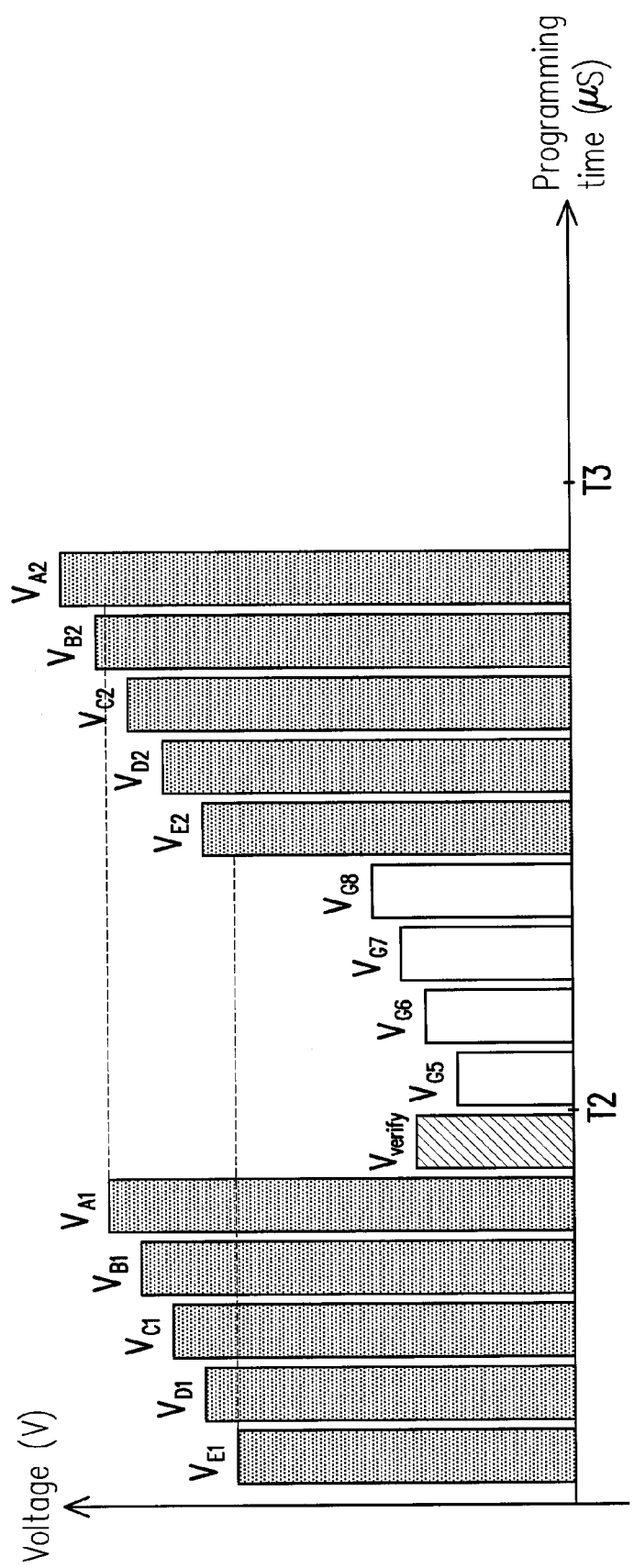

With reference to FIG. 16, it is assumed that the target memory cells are grouped into the programming groups A2 to E2 according to the grouping voltages $V_{G5}$ to $V_{G8}$. The threshold voltages of the target memory cells in the programming group E2 are greater than the threshold voltages of the target memory cells in the programming group D2; the threshold voltages of the target memory cells in the programming group D2 are greater than the threshold voltages of the target memory cells in the programming group C2; the threshold voltages of the target memory cells in the programming group C2 are greater than the threshold voltages of the target memory cells in the programming group B2; and the threshold voltages of the target memory cells in the programming group B2 are greater than the threshold voltages of the target memory cells in the programming group A2. The memory control circuit unit 104 instructs the rewritable non-volatile memory module 106 to apply program voltages $V_{A2}$ to $V_{E2}$ respectively to the programming groups A2 to E2. Therein, the program voltage $V_{A2}$ is applied to the programming group A2, the program voltage $V_{B2}$ is applied to the programming group B2, and so on. A voltage level of each of the program voltage $V_{A2}$ to $V_{E2}$ may be obtained by looking up in a look-up table according to the threshold voltage distribution of each of the programming groups A2 to E2. Alternatively, the voltage level of each of the program voltage $V_{A2}$ to $V_{E2}$ may also be obtained by modifying the program voltage $V_{A1}$ to $V_{E1}$ according to the threshold voltage distribution of each of the programming groups A2 to E2, which is not limited in the present invention. Additionally, in the present exemplary embodiment, the program voltage $V_{E2}$ is higher than the program voltage $V_{E1}$; the program voltage $V_{D2}$ is higher than the program voltage $V_{D1}$; the program voltage $V_{C2}$ is higher than the program voltage $V_{C1}$; the program voltage $V_{B2}$ is higher than the program voltage $V_{B1}$; and the program voltage $V_{A2}$ is higher than the program voltage $V_{A1}$.

It is to be mentioned that the present invention is not intent to limit the number and the time points to perform the grouping operation during a plurality of programming processes of the same write data. For instance, in an exemplary embodiment, before each programming process is performed, the grouping operation is performed. Alternatively, the memory control circuit unit 104 may also perform the grouping operation directly on the unprogrammed target memory cells (i.e., the memory cells in an erasing state). Thereafter, the memory control circuit unit 104 may perform all the subsequent programming process based on the grouping result or re-perform a grouping operation before any certain programming processes.

Figure 17A:
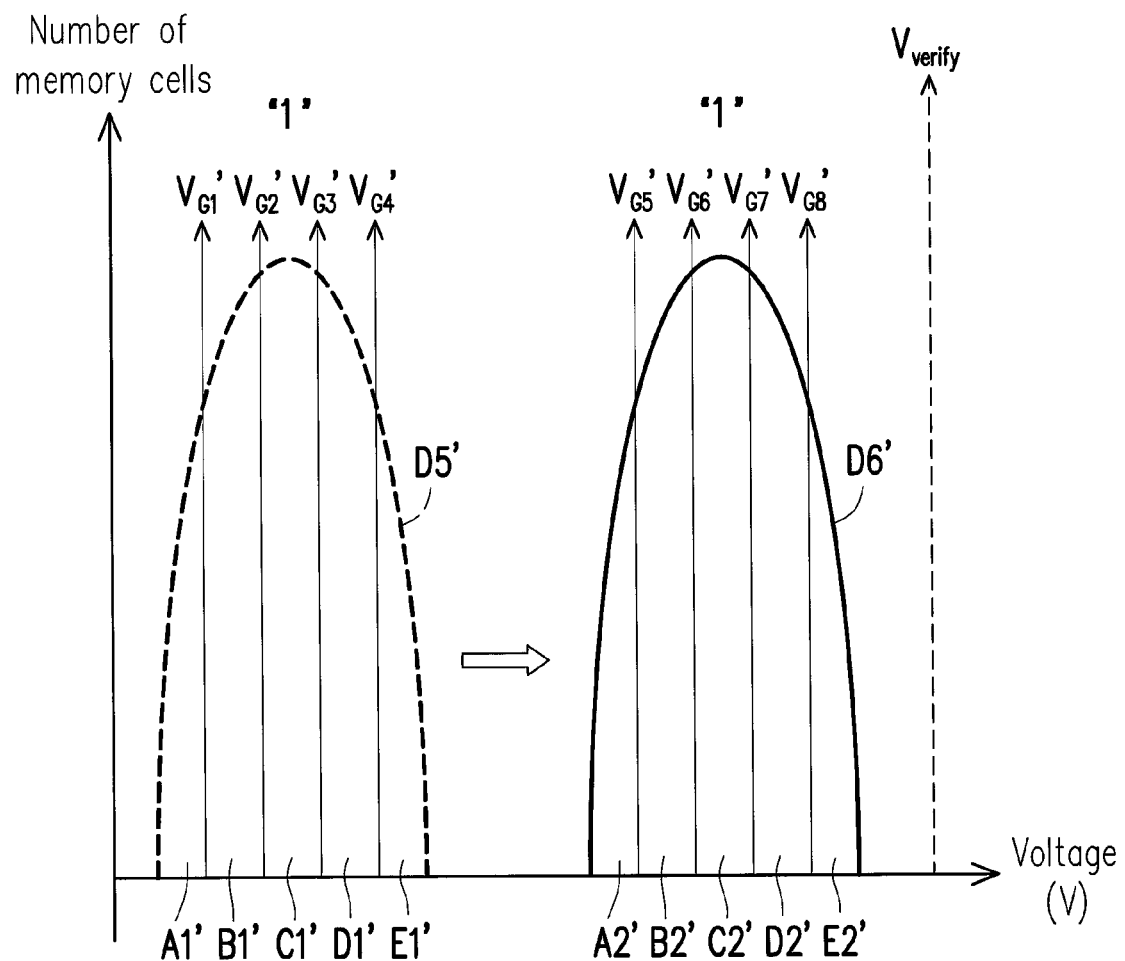
FIG. 17A is a schematic graph of grouping the memory cells according to another exemplary embodiment of the present invention.
Figure 17B:
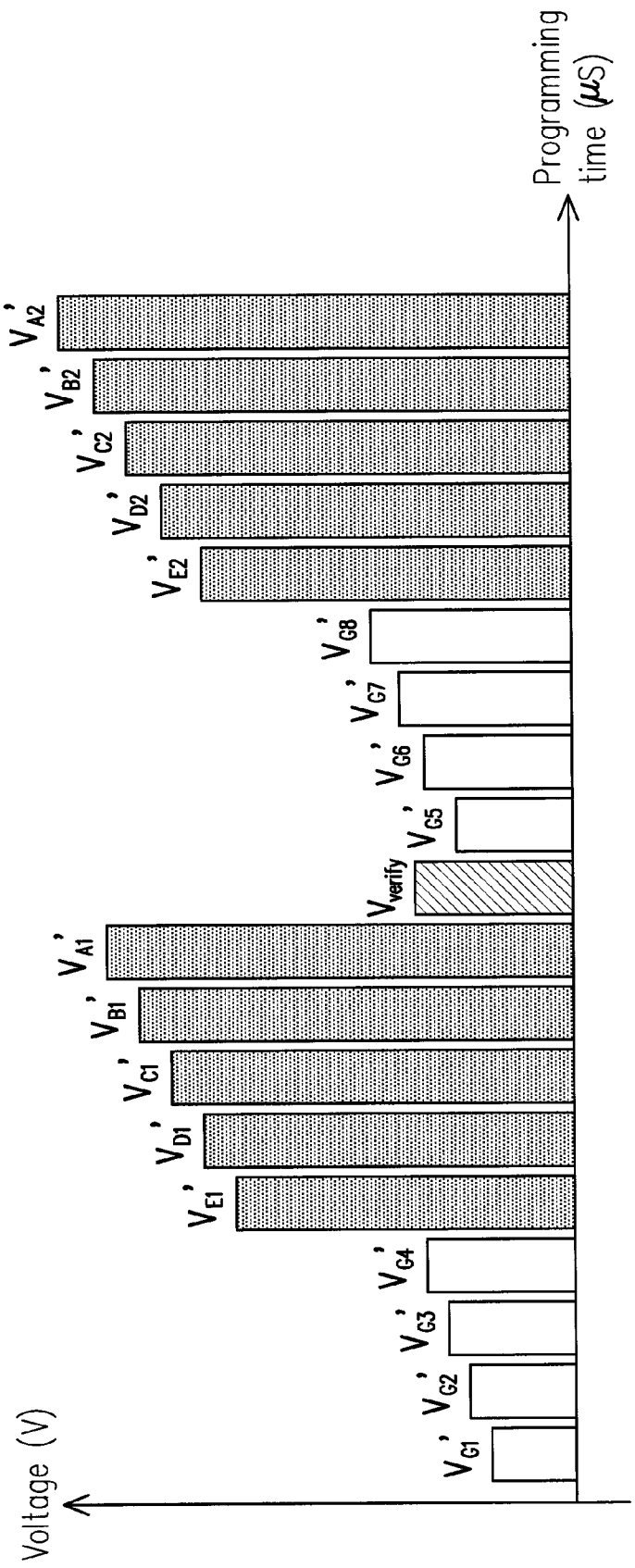
FIG. 17B is a schematic graph of a memory programming operation according to another exemplary embodiment of the present invention.

FIG. 17A is a schematic graph of grouping the memory cells according to another exemplary embodiment of the present invention. FIG. 17B is a schematic graph of a memory programming operation according to another exemplary embodiment of the present invention.

With reference to FIGS. 17A and 17B, it is assumed that the threshold voltage distribution of the target memory cells in the erasing state is threshold voltage distribution D5'. Before performing a programming process on the target memory cells, the memory control circuit unit 104 may instruct to set grouping voltages $V_{G1}'$ to $V_{G4}'$ according to the threshold voltage distribution D5' and apply the grouping voltages $V_{G1}'$ to $V_{G4}'$ to the target memory cells for grouping. Alternatively, the memory control circuit unit 104 may also group the target memory cells in the erasing state according to historical grouping information of the target memory cells. For instance, the memory control circuit unit 104 may group the target memory cells into programming groups A1' to E1'. Then, the memory control circuit unit 104 may instruct the rewritable non-volatile memory module 106 to apply corresponding program voltages $V_{A1}'$ to $V_{E1}'$ to the programming groups A1' to E1'. For instance, after the program voltages $V_{A1}'$ to $V_{E1}'$ are applied, the threshold voltage distribution of the target memory cells may become threshold voltage distribution D6'. Then, the memory control circuit unit 104 determines whether the storage states of the target memory cells are in the accurate storage state corresponding to the write data according to the verification voltage $V_{verify}$. Since voltage levels of the target memory cells in the threshold voltage distribution D6' are all smaller than the verification voltage $V_{verify}$, the memory control circuit unit 104 determines that the storage states of the target memory cells are not in the accurate storage state corresponding to the write data and continue to perform a subsequent programming process on the target memory cells. In the present exemplary embodiment, before performing the subsequent programming process, the memory control circuit unit 104 re-groups the target memory cells. For instance, the memory control circuit unit 104 may instruct to apply grouping voltages $V_{G5}'$ to $V_{G8}'$ to the target memory cells to group the target memory cells into programming groups A2' to E2'. Thereby, in the subsequent programming process, the memory control circuit unit 104 may instruct the rewritable non-volatile memory module 106 to apply corresponding program voltages $V_{A2}'$ to $V_{E2}'$ to program the target memory cells according to the programming groups A2' to E2'. Details with respect to how to perform the grouping operation and to group the memory cells by using the corresponding program voltages has been described above and will not be repeated.

It is to be mentioned that in the exemplary embodiment illustrated in FIG. 17B, the initial programming process for programming the target memory cells in the erasing state uses the plurality of program voltages $V_{A1}'$ to $V_{E1}'$. However, in another exemplary embodiment illustrated in FIG. 17B, even though the target memory cells are grouped, the initial programming process for programming the target memory cells in the erasing state may use only one initial program voltage, e.g., one of the program voltages $V_{A1}'$ to $V_{E1}'$ or any one adaptive program voltage. Additionally, in an exemplary embodiment, the memory control circuit unit 104 only groups the target memory cells according to the programming result of the initial program voltage after performing the initial programming process, and the grouping result may be continuously used until the target memory cells are programmed to be in the accurate storage state. Alternatively, the memory control circuit unit 104 may re-perform a grouping operation before any programming process after the initial programming process. Additionally, in another exemplary embodiment, the memory control circuit unit 104 may stop performing any other grouping operation after the number of performing the grouping operation on the target memory cells reaches a maximum number of grouping and perform one or more subsequent programming processes according to programming groups obtained in the last grouping operation. For instance, if it is assumed that the maximum number of grouping is 2, then after performing the grouping operation on the target memory cells for twice, the memory control circuit unit 104 performs the subsequent programming processes directly according to the programming groups obtained in the second grouping operation.

Figure 18:
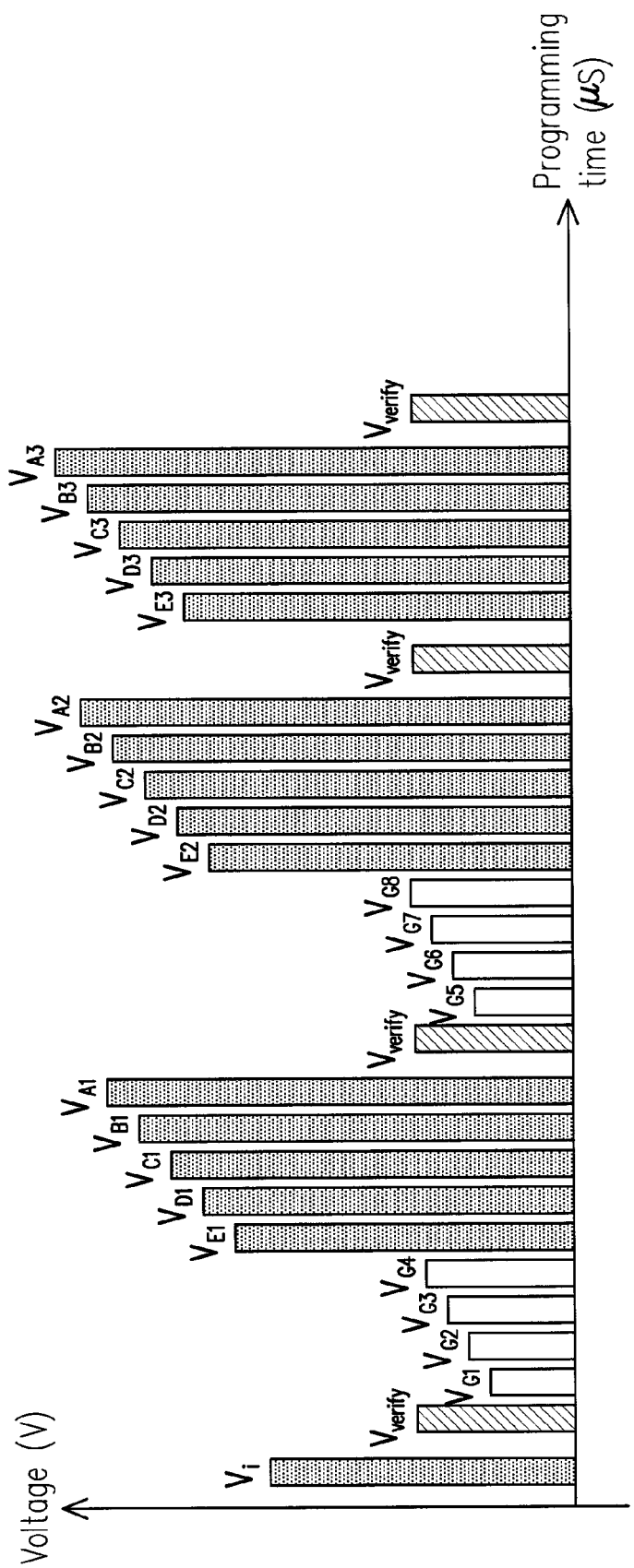
FIG. 18 is a schematic graph of a memory programming operation according to another exemplary embodiment of the present invention.

FIG. 18 is a schematic graph of a memory programming operation according to another exemplary embodiment of the present invention.

With reference to FIG. 18, it is assumed that the memory control circuit unit 104 respectively performs the grouping operation for twice before two programming processes after the initial programming process. After the memory control circuit unit 104 instructs to apply the program voltages $V_{A2}$ to $V_{E2}$ to the target memory cells, if the memory control circuit unit 104 determines that the storage states of the target memory cells are not all in the accurate storage state and the number of the grouping operations reach the maximum number of grouping (e.g., twice), then the memory control circuit unit 104 no longer groups the target memory cells in the subsequent programming process for writing the same data. For instance, in the next programming process, the memory control circuit unit 104 respectively applies the program voltages $V_{A3}$ to $V_{E3}$ to the target memory cells in the programming groups A2 to E2 directly according to the programming groups A2 to E2 obtained by the second grouping operation.

Figure 19:
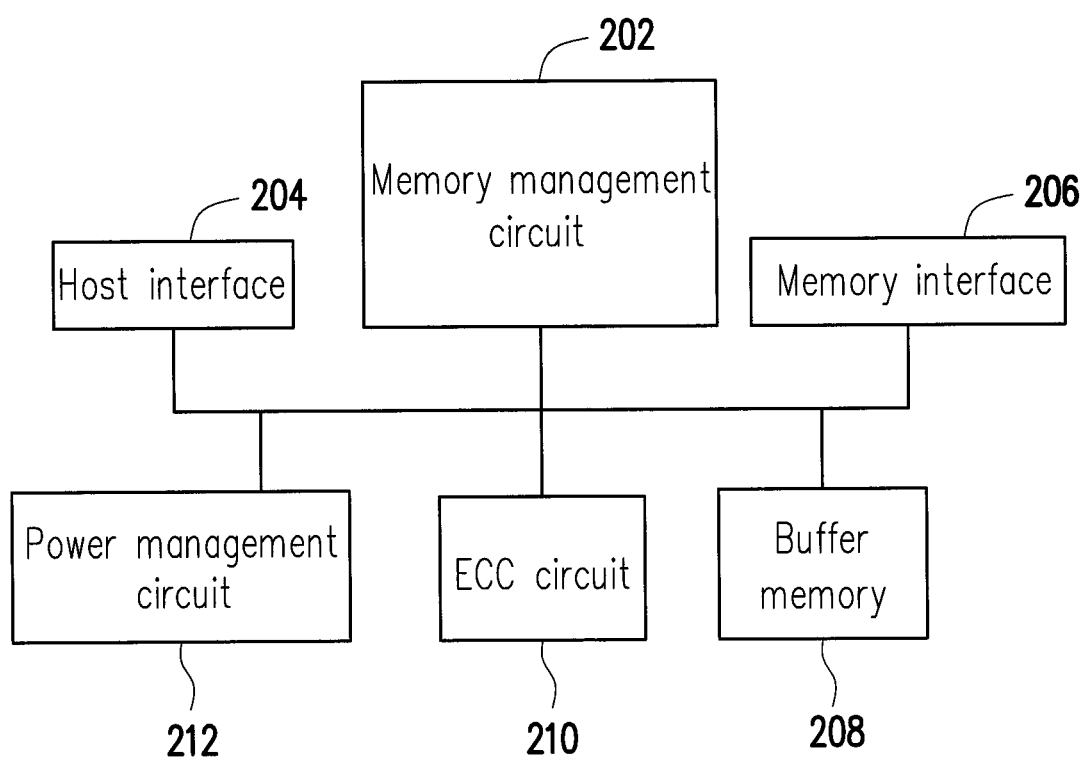
FIG. 19 is a schematic block diagram illustrating a memory control circuit unit according to another exemplary embodiment of the present invention.

FIG. 19 is a schematic block diagram illustrating a memory control circuit unit according to another exemplary embodiment of the present invention.

With reference to FIG. 19, the memory control circuit unit 104 includes a memory management circuit 202, a host interface 204, a memory interface 206, buffer memory 208, an error detecting and correcting (ECC) circuit 210 and a power management circuit 212.

The memory management circuit 202 is configured to control the overall operation of the memory control circuit unit 104. Specifically, the memory management circuit 202 has a plurality of control commands. When the memory storage device 10 is in operation, the control commands are executed to perform operations such as data writing, reading and erasing operations.

In the present exemplary embodiment, the control commands of the memory management circuit 202 are implemented in the form of firmware. For instance, the memory management circuit 202 has a microprocessor unit (not shown) and a read-only memory (not shown), and the control commands are burnt into the read-only memory. When the memory storage device 10 is in operation, the control commands are executed by the microprocessor to perform the operations such as data writing, reading and erasing operations. The aforementioned description with respect to the operations of the memory control circuit unit 104 may be applied to the memory management circuit 202.

In another exemplary embodiment, the control commands of the memory management circuit 202 may also be stored in a form of programming codes in a specific area of the rewritable non-volatile memory module 106 (e.g., the system area specifically designated for storing the system data). Besides, the memory management circuit 202 has a microprocessor (not shown), a read-only memory (not shown), and a random access memory (not shown). In particular, the read-only memory stores boot codes, and when the memory control circuit unit 104 is enabled, the microprocessor unit first executes the boot codes to load the control instructions stored in the rewritable non-volatile memory module 106 to the random access memory of the memory management circuit 202. Afterwards, the microprocessor unit executes the control commands for various data operations such as data writing, reading and erasing operations.

In another exemplary embodiment, the control commands of the memory management circuit 202 may also be implemented in the hardware form. For instance, the memory management circuit 202 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are electrically connected to the microcontroller. Therein, the memory cell management circuit is configured to manage physical erasing units of the rewritable non-volatile memory module 106; the memory writing circuit is configured to issue a write command (i.e., a write command sequence) to the rewritable non-volatile memory module 106 to write data into the rewritable non-volatile memory module 106; the memory reading circuit is configured to is configured to issue a read instruction (i.e., a read instruction sequence) to the rewritable non-volatile memory module 106 to read data from the rewritable non-volatile memory module 106; the memory erasing circuit is configured to issue an erase instruction to the rewritable non-volatile memory module 106 to erase data from the rewritable non-volatile memory module 106; and the data processing circuit is configured to process data to be written into the rewritable non-volatile memory module 106 and data to be read from the rewritable non-volatile memory module 106. Each of the write command sequence, the read instruction sequence and erase instruction may include one or a plurality of program codes or instructions.

The host interface 204 is coupled to the memory management circuit 202 and configured to receive and identify the commands and data transmitted by the host system 11. In other words, the commands and data from the host system 11 are transmitted to the memory management circuit 202 through the host interface 204. In the present exemplary embodiment, the host interface 204 complies with the SATA standard. However, it be understood that the present invention is not limited thereto, and the host interface 204 may also comply with the PATA standard, the IEEE 1394 standard, the PCI Express standard, the USB standard, the UHS-I interface standard, the UHS-II interface standard, the MS standard, the MMC standard, the CF standard, the IDE standard or other suitable data transmission standard.

The memory interface 206 is coupled to memory management circuit 202 and configured to access the rewritable non-volatile memory module 106. Namely, data to be written into the rewritable non-volatile memory module 106 is converted to a format acceptable for the rewritable non-volatile memory module 106 by the memory interface 206. Specifically, if the memory management circuit 202 is about to access the rewritable non-volatile memory module 106, the memory interface 206 transmits a corresponding instruction sequence. The instruction sequence may include one or a plurality of signals, or data on a bus. For instance, a read instruction sequence may contain information, such as a read identification code, a memory address, and so on.

The buffer memory 208 is coupled to memory management circuit 202 and configured to temporarily store the data and instructions from the host system 1000 or data from the rewritable non-volatile memory module 106. The memory control circuit unit 404 configures to temporarily store the data from the host system 11 or the data from the rewritable non-volatile memory module 106 in the buffer memory 208, such that the data are organized to be in a predetermined unit size or a transmission unit size and written into the rewritable non-volatile memory module 106 or transmitted back to the host system 11. In addition, the buffer memory 208 may also temporarily store system management data used by the memory control circuit unit 104, such as a file allocation table or a logical-physical unit mapping table.

The ECC circuit 210 is coupled to the memory management circuit 202 and configured to perform an error checking and correcting (ECC) procedure to ensure accuracy of data. Specifically, when the memory management circuit 202 receives a write command from the host system 11, the ECC circuit 210 may generate a corresponding error correcting code (ECC code) and/or error detecting code (EDC) for data corresponding to the write command. The memory management circuit 202 may write the data corresponding to the writing command and the corresponding ECC code into the rewritable non-volatile memory module 106. Thereafter, when the memory management circuit 202 reads the data from the rewritable non-volatile memory module 106, the corresponding ECC code and/or EDC are also read, and the ECC circuit 210 performs the ECC procedure on the read data according to the ECC code and/or the EDC.

The power management circuit 212 is coupled to the memory management circuit 202 and configured to control a power source of the memory storage device 10.

It is to be mentioned that in an exemplary embodiment, a specific program voltage may be applied to a specific programming group through the control of software or firmware. Alternatively, in another exemplary embodiment, the program voltages applied to different programming groups may be controlled through hardware switches. For instance, if the program voltages applied to different programming groups are controlled by hardware switches, one or more control switches or resisters may be disposed on voltage supply paths for supplying the programming voltages. Each control switch or resister is configured to conduct on a voltage supply path for the memory cells belonging to the same programming group. Through conducting on or switching voltage supply paths coupled to different memory cells, the memory cells belonging to different programming groups may be selectively programmed. Taking the exemplary embodiment illustrated in FIG. 14 for example, if it is assumed that the programming group A1 is to be programmed by using the program voltage $V_{A1}$, the voltage supply path coupled to the target memory cells belonging to the programming group A1 is conducted on, and the voltage supply path coupled to the target memory cells not belonging to the programming group A1 is cut off. Thereby, the program voltage $V_{A1}$ is only provided to the target memory cells belonging to the programming group A1 for programming through the conducted-on voltage supply path. When the program voltage $V_{B1}$ is to be used to program the programming group B1, only the voltage supply path coupled to the target memory cells belonging to the programming group B1 is conducted on to program the programming group B1, and so on, likewise.

Figure 20:
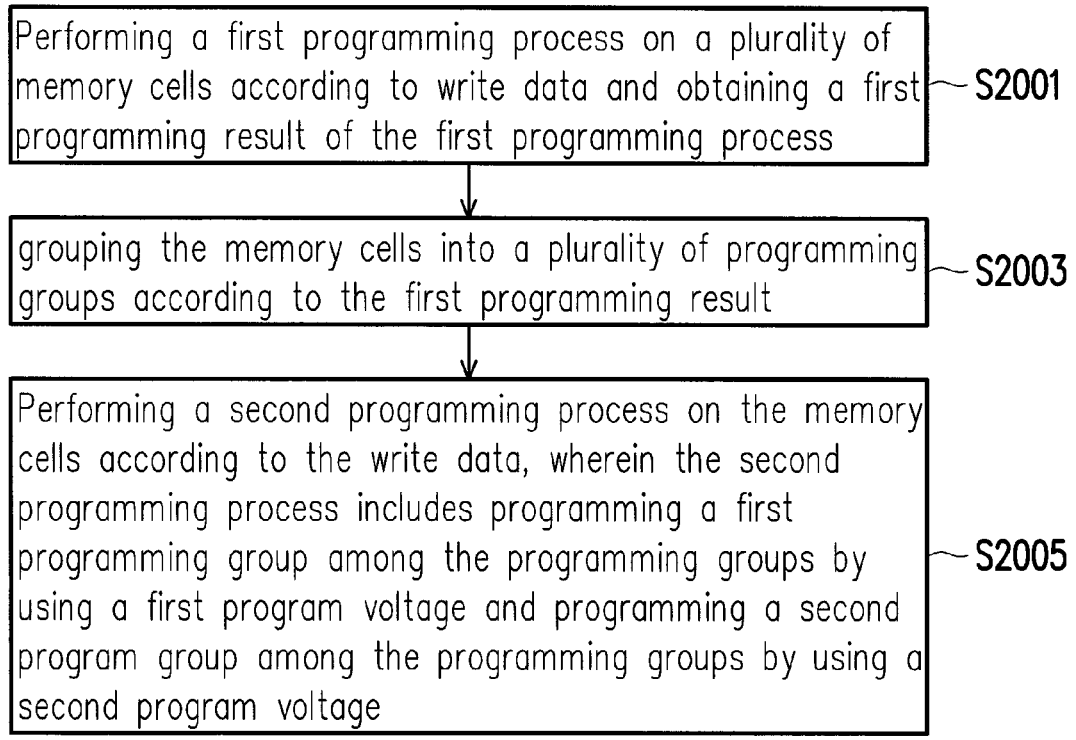
FIG. 20 is a flowchart illustrating a memory programming method according to an exemplary embodiment of the present invention.

FIG. 20 is a flowchart illustrating a memory programming method according to an exemplary embodiment of the present invention.

With reference to FIG. 20, in step S2001, the memory control circuit unit 104 (or the memory management circuit 202) performs a first programming process of a plurality of memory cells according to write data and obtains a first programming result of the first programming process. In step S2003, the memory control circuit unit 104 (or the memory management circuit 202) instructs to group the memory cells into a plurality of programming groups according to the first programming result. In step S2005, the memory control circuit unit 104 (or the memory management circuit 202) instructs to perform a second programming process on the memory cells according to the write data. The second programming process includes programming a first programming group among the programming groups by using a first program voltage and programming a second programming group among the programming groups by using a second program voltage. Therein, the first program voltage and the second program voltage are different.

Figure 21:
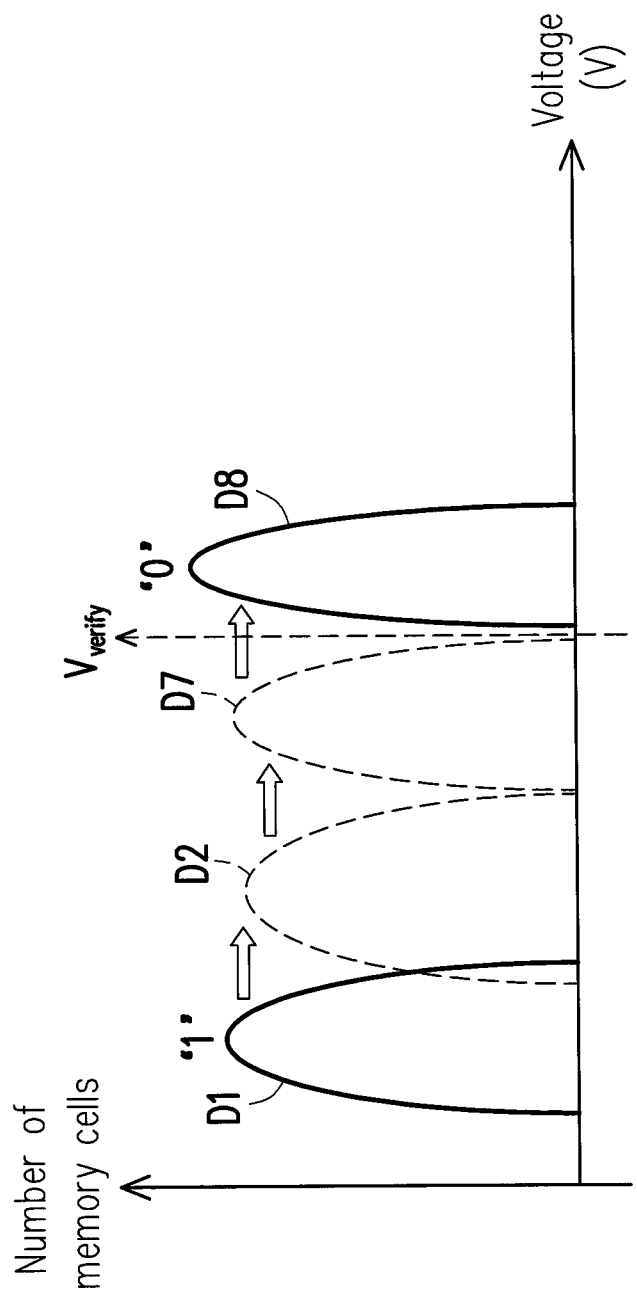
FIG. 21 is a schematic graph illustrating a threshold voltage distribution of the programmed memory cells according to an exemplary embodiment of the present invention.

FIG. 21 is a schematic graph illustrating a threshold voltage distribution of the programmed memory cells according to an exemplary embodiment of the present invention.

With reference to FIG. 15 and FIG. 21, it is assumed that the memory control circuit unit 104 instruct to program a plurality of memory cells according to write data having data bits of "0", and then after a first programming process is performed by using the initial program voltage $V_i$, a threshold voltage distribution of the memory cells is changed from the threshold voltage distribution D1 to the threshold voltage distribution D2. Before the second programming process, the memory control circuit unit 104 instructs to group the memory cells by using the grouping voltages $V_{G1}$ to $V_{G4}$, and after the memory cells are grouped, the second programming process is performed by using the corresponding program voltages $V_{A1}$ to $V_{E1}$ according to the programming groups A1 to E1 that the memory cells belong to. After the second programming process is performed, the threshold voltage distribution of the memory cells are changed from the threshold voltage distribution D2 to a threshold voltage distribution D7. In this way, after other programming processes are performed, the threshold voltage distribution of the memory cells is changed from the threshold voltage distribution D7 to a threshold voltage distribution D8. Then, since the threshold voltages of the memory cells are higher than the verification voltage $V_{verify}$, it represents that the storage states of the memory cells are all programmed as "0".

According to both FIG. 3 and FIG. 21, in the memory programming method of the present invention, the threshold voltage distribution range of the memory cells may be effectively narrowed in the process of programming the memory cells. Namely, the threshold voltage distribution of the memory cells may be concentrated. Additionally, the highest threshold voltage in the threshold voltage distribution D8 of the memory cells in FIG. 21 may be smaller than the highest threshold voltage in the threshold voltage distribution D4 of the memory cells in FIG. 3.

To summarize, in the memory programming method, the memory control circuit unit and the memory storage device provided by the present invention, the memory cells can be grouped, and the program voltages applied to different groups can be correspondingly adjusted according to the threshold voltage distribution (or the write speed) of the memory cells, so as to enhance the accuracy of programming the memory cells and extend the lifespan of the memory storage device. Moreover, the range of the threshold voltage distribution of the programmed memory cells can be narrowed, so as to reduce the possibility of error occurring in the data stored in the memory storage device.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory programming method for a rewritable non-volatile memory module having a plurality of memory cells, the memory programming method comprising:
    performing a first programming process on the memory cells according to first write data and obtaining a first programming result of the first programming process;
    grouping the memory cells into a plurality of programming groups according to the first programming result;
    performing a second programming process on the memory cells according to the first write data, wherein the second programming process comprises:
        programming a first programming group among the programming groups by using a first program voltage; and
        programming a second programming group among the programming groups by using a second program voltage, wherein the first program voltage and the second program voltage are different; and
    after the first write data is programmed, performing the second programming process on the memory cells according to a second write data without performing the first programming process according to the second write data.

2. The memory programming method according to claim 1, wherein a first voltage distribution range of the first programming group and a second voltage distribution range of the second programming group are different.

3. The memory programming method according to claim 2, wherein a first threshold voltage of a first memory cell in the first programming group is smaller than a second threshold voltage of a second memory cell in the second programming group,
    wherein the first threshold program voltage is greater than the second threshold program voltage.

4. The memory programming method according to claim 1, wherein the step of grouping the memory cells into the programming groups according to the first programming result comprises:
    providing at least one grouping voltage to the memory cells to obtain storage state information of the memory cells, wherein the storage state information indicates a voltage distribution status of the memory cells; and
    grouping the memory cells into the programming groups according to the storage state information.

5. The memory programming method according to claim 1, further comprising:
    determining whether the first programming result meets a predetermined programming result corresponding to the first write data,
    wherein the step of grouping the memory cells into the programming groups according to the first programming result is performed after determining that the first programming result does not meet the predetermined programming result.

6. The memory programming method according to claim 5, wherein the step of determining whether the first programming result meets the predetermined programming result comprises:
    providing a verification voltage to the memory cells to determine whether a storage state of the memory cells is in an accurate storage state corresponding to the first write data;
    if the storage state of the memory cells is in the accurate storage state corresponding to the first write data, determining that the first programming result meets the predetermined programming result; and
    if the storage state of the memory cells is not in the accurate storage state corresponding to the first write data, determining that the first programming result does not meet the predetermined programming result.

7. The memory programming method according to claim 1, further comprising:
    grouping the memory cells into a third programming group and a fourth programming group before performing the first programming process.

8. The memory programming method according to claim 7, wherein a third threshold voltage of a third memory cell in the third programming group is smaller than a fourth threshold voltage of a fourth memory cell in the fourth programming group,
    wherein the first programming process comprises:
    programming the third programming group by using a third program voltage; and
    programming the fourth programming group by using a fourth program voltage,
    wherein the third program voltage is greater than the fourth program voltage, the first program voltage is greater than the third program voltage, and the second program voltage is greater than the fourth program voltage.

9. A memory storage device, comprising:
    a connection interface unit configured to couple to a host system;
    a rewritable non-volatile memory module comprising a plurality of memory cells; and
    a memory control circuit unit coupled to the connection interface unit and the rewritable non-volatile memory module,
    wherein the memory control circuit unit is configured to transmit a first write command sequence configured to instruct to perform a first programming process on the memory cells according to first write data,
    wherein the memory control circuit unit is further configured to obtain a first programming result of the first programming process,
    wherein the memory control circuit unit is further configured to group the memory cells into a plurality of programming groups according to the first programming result,
    wherein the memory control circuit unit is further configured to transmit a second write command sequence configured to instruct to perform a second programming process on the memory cells according to the first write data, wherein the second programming process comprises:

programming a first programming group among the programming groups by using a first program voltage; and programming a second programming group among the programming groups by using a second program voltage, wherein the first program voltage and the second program voltage are different, wherein the memory control circuit unit is further configured to transmit a third write command sequence configured to instruct to perform the second programming process on the memory cells according to a second write data without performing the first programming process on the memory cells according to the second write data.

10. The memory storage device according to claim 9, wherein a first voltage distribution range of the first programming group and a second voltage distribution range of the second programming group are different.

11. The memory storage device according to claim 10, wherein a first voltage of a first memory cell in the first programming group is smaller than a second voltage of a second memory cell in the second programming group, wherein the first program voltage is greater than the second program voltage.

12. The memory storage device according to claim 9, wherein the operation of the memory control circuit unit grouping the memory cells into the programming groups according to the first programming result comprise:

transmitting a grouping instruction configured to instruct to provide at least one grouping voltage to the memory cells to obtain storage state information of the memory cells, wherein the storage state information indicates a voltage distribution status of the memory cells; and grouping the memory cells into the programming groups according to the storage state information.

13. The memory storage device according to claim 9, wherein the memory control circuit unit is further configured to determine whether the first programming result meets a predetermined programming result corresponding to the first write data, wherein the operation of the memory control circuit unit grouping the memory cells into the programming groups according to the first programming result is performed after determining that the first programming result does not meet the predetermined programming result.

14. The memory storage device according to claim 13, wherein the operation of the memory control circuit unit determining whether the first programming result meets the predetermined programming result corresponding to the first write data comprises:

transmitting a verification instruction configured to instruct to provide a verification voltage to the memory cells to determine whether a storage state of the memory cells is in an accurate storage state corresponding to the first write data;

if the storage state of the memory cells is in the accurate storage state corresponding to the first write data, determining that the first programming result meets the predetermined programming result; and if the storage state of the memory cells is not in the accurate storage state corresponding to the first write data, determining that the first programming result does not meet the predetermined programming result.

15. The memory storage device according to claim 9, wherein the memory control circuit unit is further configured to group the memory cells into a third programming group and a fourth programming group before the first programming process is performed.

16. The memory storage device according to claim 15, wherein a third voltage of a third memory cell in the third programming group is smaller than a fourth voltage of a fourth memory cell in the fourth programming group, wherein the first programming process comprises:

programming the third programming group by using a third program voltage; and programming the fourth programming group by using a fourth program voltage, wherein the third program voltage is greater than the fourth program voltage, the first program voltage is greater than the third program voltage, and the second program voltage is greater than the fourth program voltage.

17. A memory control circuit unit configured to control a rewritable non-volatile memory module having a plurality of memory cells, the memory control circuit unit comprising:

a host interface configured to couple to a host system;

a memory interface configured to couple to the rewritable non-volatile memory module; and a memory management circuit coupled to the host interface and the memory interface, wherein the memory management circuit is configured to transmit a first write command sequence configured to instruct to perform a first programming process on the memory cells according to first write data, wherein the memory management circuit is further configured to obtain a first programming result of the first programming process, wherein the memory management circuit is further configured to group the memory cells into a plurality of programming groups according to the first programming result, wherein the memory management circuit is further configured to transmit a second write command sequence configured to instruct to perform a second programming process on the memory cells according to the first write data, wherein the second programming process comprises:

programming a first programming group among the programming groups by using a first program voltage; and programming a second programming group among the programming groups by using a second program voltage, wherein the first program voltage and the second program voltage are different, wherein the memory management circuit is further configured to transmit a third write command sequence configured to instruct to perform the second programming process on the memory cells according to a second write data without performing the first programming process on the memory cells according to the second write data.

18. The memory control circuit unit according to claim 17, wherein a first voltage distribution range of the first programming group and a second voltage distribution range of the second programming group are different.

19. The memory control circuit unit according to claim 18, wherein a first voltage of a first memory cell in the first programming group is smaller than a second voltage of a second memory cell in the second programming group, wherein the first program voltage is greater than the second program voltage.

20. The memory control circuit unit according to claim 17, wherein the operation of the memory management circuit grouping the memory cells into the programming groups according to the first programming result comprises:
  transmitting a grouping instruction configured to instruct to provide at least one grouping voltage to the memory cells to obtain storage state information of the memory cells, wherein the storage state information indicates a voltage distribution status of the memory cells; and
  grouping the memory cells into the programming groups according to the storage state information.

21. The memory control circuit unit according to claim 17, wherein the memory management circuit is further configured to determine whether first programming result meets a predetermined programming result corresponding to the first write data,
  wherein the operation of the memory management circuit grouping the memory cells into the first programming group according to the first programming result is performed after determining that the first programming result does not meet the predetermined programming result.

22. The memory control circuit unit according to claim 21, wherein the operation of the memory management circuit determining whether the first programming result meets the predetermined programming result corresponding to the first write data comprises:
  transmitting a verification instruction configured to instruct to provide a verification voltage to the memory cells to determine whether a storage state of the memory cells is in an accurate storage state corresponding to the first write data;
  if the storage state of the memory cells is the accurate storage state corresponding to the first write data, determining that the first programming result meets the predetermined programming result; and
  if the storage state of the memory cells is not in the accurate storage state corresponding to the first write data, determining that the first programming result does not meet the predetermined programming result.

23. The memory control circuit unit according to claim 17, wherein the memory management circuit is further configured to group the memory cells into a third programming group and a fourth programming group before the first programming process is performed.

24. The memory control circuit unit according to claim 23, wherein a third voltage of a third memory cell in the third programming group is smaller than a fourth voltage of a fourth memory cell in the fourth programming group,
  wherein the first programming process comprises:
  programming the third programming group by using a third program voltage; and
  programming the fourth programming group by using a fourth program voltage,
  wherein the third program voltage is greater than the fourth program voltage, the first program voltage is greater than the third program voltage, and the second program voltage is greater than the fourth program voltage.

* * * * *